US010134910B2

(12) United States Patent
Suzuki et al.

(10) Patent No.: US 10,134,910 B2
(45) Date of Patent: Nov. 20, 2018

(54) SEMICONDUCTOR DEVICE AND PRODUCTION METHOD THEREFOR

(71) Applicant: Sharp Kabushiki Kaisha, Sakai, Osaka (JP)

(72) Inventors: Masahiko Suzuki, Sakai (JP); Hajime Imai, Sakai (JP); Hisao Ochi, Sakai (JP); Tetsuo Fujita, Sakai (JP); Hideki Kitagawa, Sakai (JP); Tetsuo Kikuchi, Sakai (JP); Shingo Kawashima, Sakai (JP); Tohru Daitoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/531,423

(22) PCT Filed: Nov. 19, 2015

(86) PCT No.: PCT/JP2015/082536
§ 371 (c)(1),
(2) Date: May 27, 2017

(87) PCT Pub. No.: WO2016/084699
PCT Pub. Date: Jun. 2, 2016

(65) Prior Publication Data
US 2017/0345940 A1     Nov. 30, 2017

(30) Foreign Application Priority Data
Nov. 28, 2014    (JP) ................................ 2014-242536

(51) Int. Cl.
*H01L 29/10*     (2006.01)
*H01L 29/786*    (2006.01)
(Continued)

(52) U.S. Cl.
CPC ........ *H01L 29/7869* (2013.01); *G02F 1/1368* (2013.01); *G09F 9/00* (2013.01);
(Continued)

(58) Field of Classification Search
CPC ..... H01L 33/62; H01L 51/0072; H01L 51/56; H01L 33/60; H01L 2251/558
(Continued)

(56) References Cited

U.S. PATENT DOCUMENTS

2002/0034874 A1    3/2002   Aoki
2011/0127524 A1    6/2011   Yamazaki et al.
(Continued)

FOREIGN PATENT DOCUMENTS

JP      2000-114368 A    4/2000
JP      2009-145789 A    7/2009
(Continued)

*Primary Examiner* — Andy Huynh
(74) *Attorney, Agent, or Firm* — ScienBiziP, P.C.

(57) ABSTRACT

A semiconductor device (100A) includes: a substrate (1); a thin film transistor (101) whose active layer is an oxide semiconductor layer 5; at least one metal wiring layer including copper (7S, 7D); a metal oxide film including copper (8) arranged on an upper surface of the at least one metal wiring layer (7S, 7D); an insulating layer (11) covering at least one metal wiring layer with the metal oxide film (8) interposed therebetween; and a conductive layer (19) in direct contact with a portion of the at least one metal wiring layer, without the metal oxide film (8) interposed therebetween, in an opening formed in the insulating layer (11).

15 Claims, 15 Drawing Sheets

(51) Int. Cl.

| | | |
|---|---|---|
| *G02F 1/1368* | (2006.01) | |
| *G09F 9/00* | (2006.01) | |
| *G09F 9/30* | (2006.01) | |
| *H01L 21/28* | (2006.01) | |
| *H01L 21/283* | (2006.01) | |
| *H01L 21/304* | (2006.01) | |
| *H01L 23/532* | (2006.01) | |
| *H01L 21/768* | (2006.01) | |
| *H01L 27/12* | (2006.01) | |
| *H01L 29/66* | (2006.01) | |
| *H01L 29/45* | (2006.01) | |
| *G02F 1/1362* | (2006.01) | |

(52) U.S. Cl.
CPC ............... *G09F 9/30* (2013.01); *H01L 21/28* (2013.01); *H01L 21/283* (2013.01); *H01L 21/304* (2013.01); *H01L 21/768* (2013.01); *H01L 23/532* (2013.01); *H01L 27/124* (2013.01); *H01L 27/1225* (2013.01); *H01L 27/1262* (2013.01); *H01L 29/45* (2013.01); *H01L 29/66969* (2013.01); *G02F 2001/136295* (2013.01); *H01L 2924/0002* (2013.01)

(58) Field of Classification Search
USPC .......................................................... 257/43
See application file for complete search history.

(56) References Cited

U.S. PATENT DOCUMENTS

| | | |
|---|---|---|
| 2012/0138922 A1 | 6/2012 | Yamazaki et al. |
| 2013/0122323 A1 | 5/2013 | Miki et al. |
| 2013/0140553 A1 | 6/2013 | Yamazaki et al. |
| 2013/0299817 A1* | 11/2013 | Park .................. H01L 29/45 257/43 |
| 2013/0320334 A1 | 12/2013 | Yamazaki et al. |
| 2014/0091306 A1 | 4/2014 | Miki et al. |
| 2014/0286076 A1 | 9/2014 | Aoki et al. |

FOREIGN PATENT DOCUMENTS

| | | |
|---|---|---|
| JP | 2011-135061 A | 7/2011 |
| JP | 2012-027159 A | 2/2012 |
| JP | 2012-134475 A | 7/2012 |
| JP | 2012-243779 A | 12/2012 |
| JP | 2013-138188 A | 7/2013 |
| JP | 2014-007399 A | 1/2014 |
| JP | 2014-209727 A | 11/2014 |

* cited by examiner

*FIG.2*
(a)
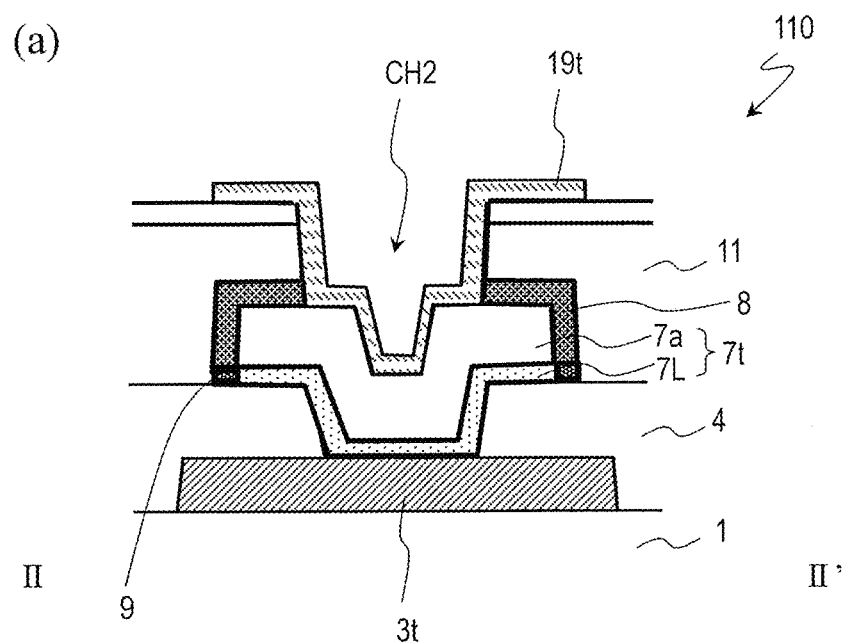
(b)
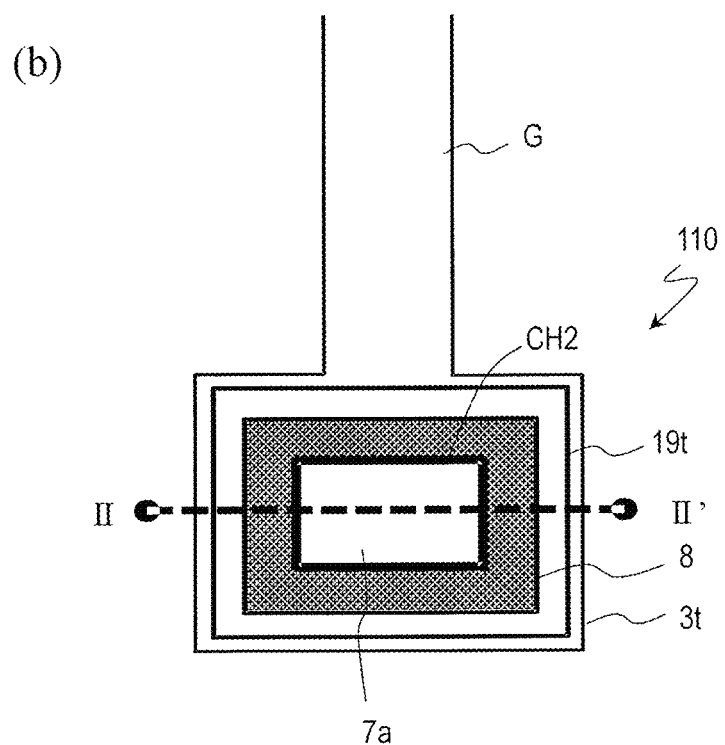

*FIG.4*
(a)　　　　　　　　　　　　　　　　(b)
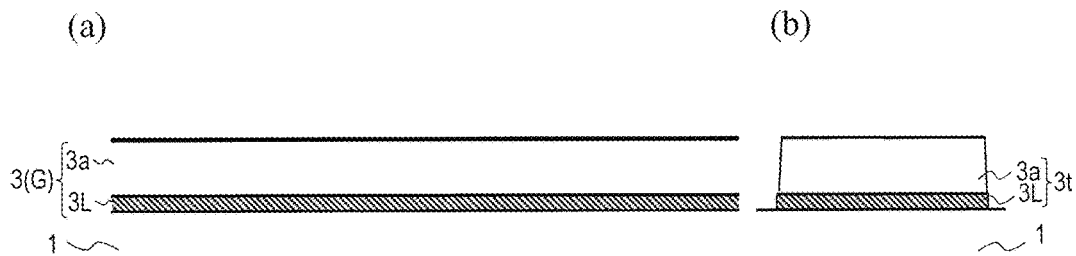
*FIG.5*
(a)　　　　　　　　　　　　　　　　(b)
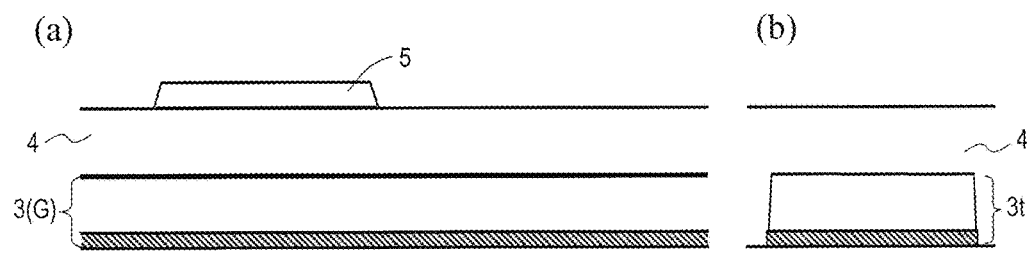
(c)　　　　　　　　　　　　　　　　(d)
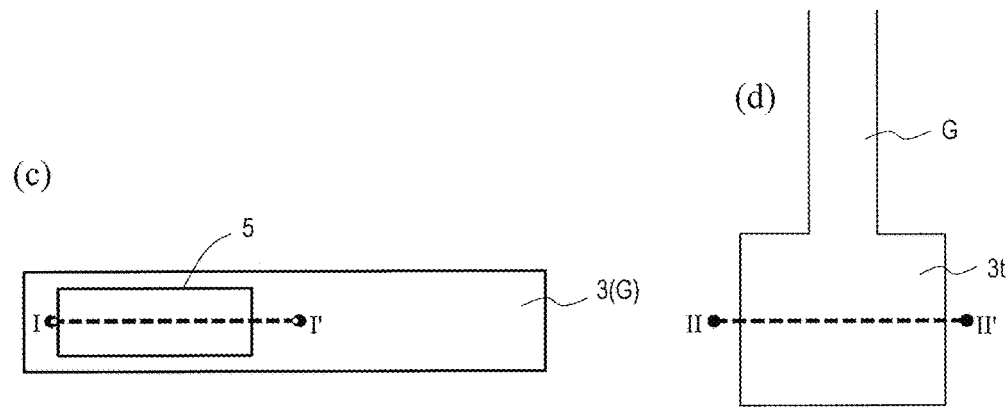
*FIG.6*
(a)　　　　　　　　　　　　　　　　(b)
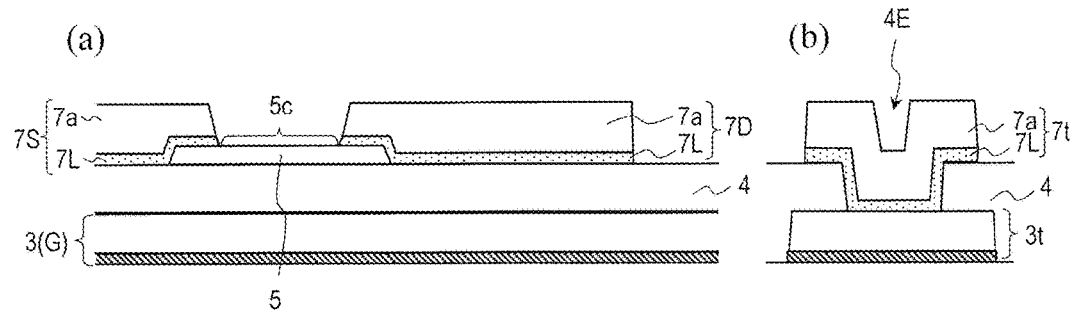

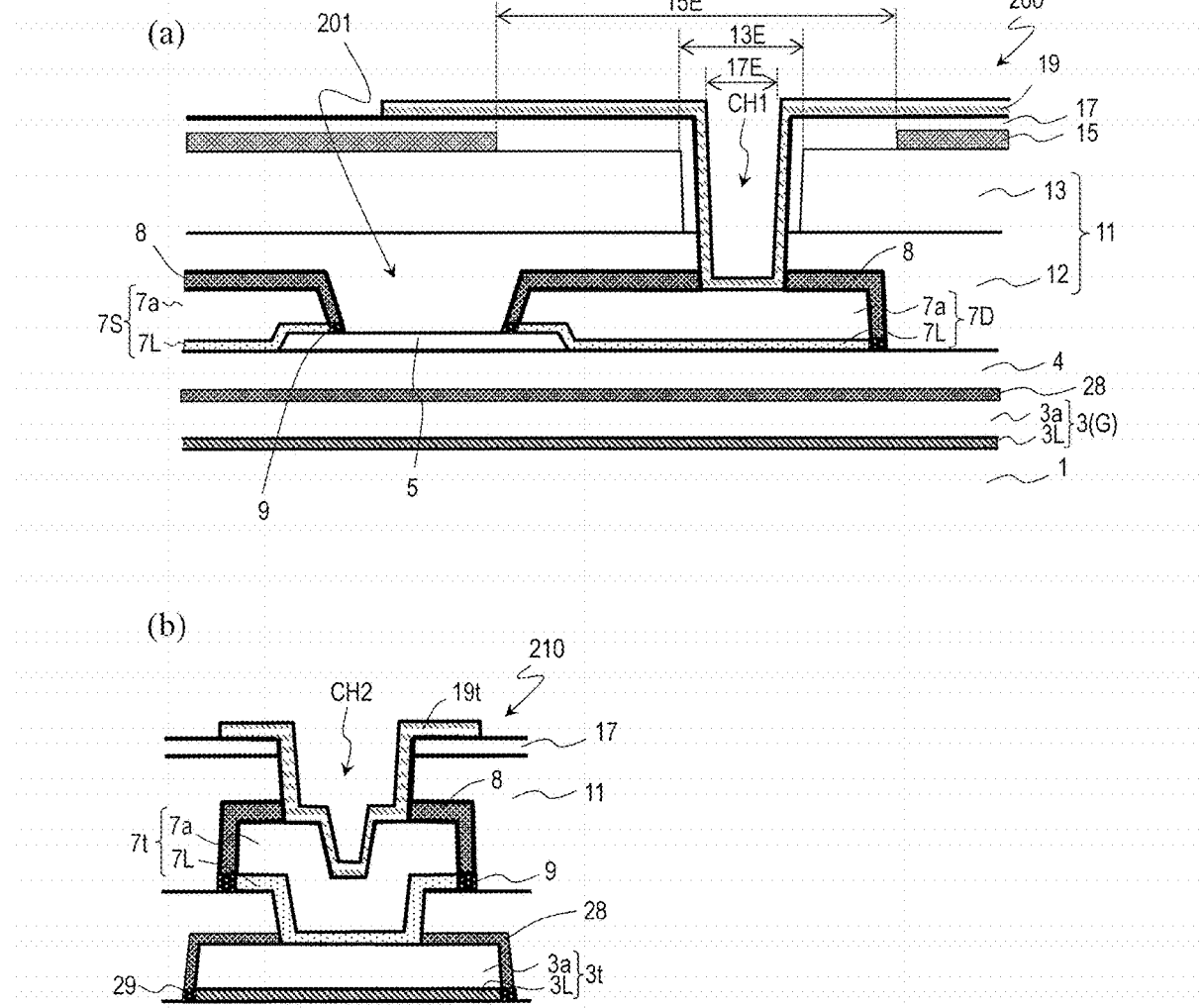
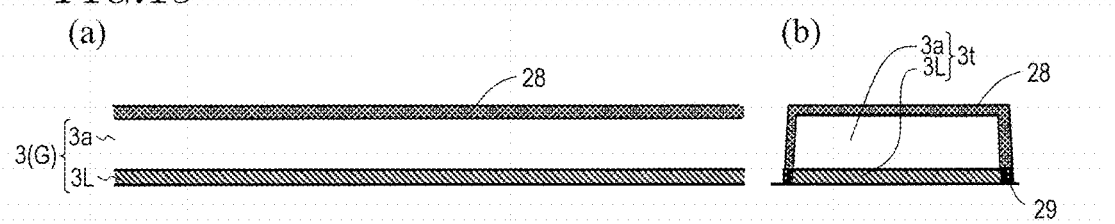
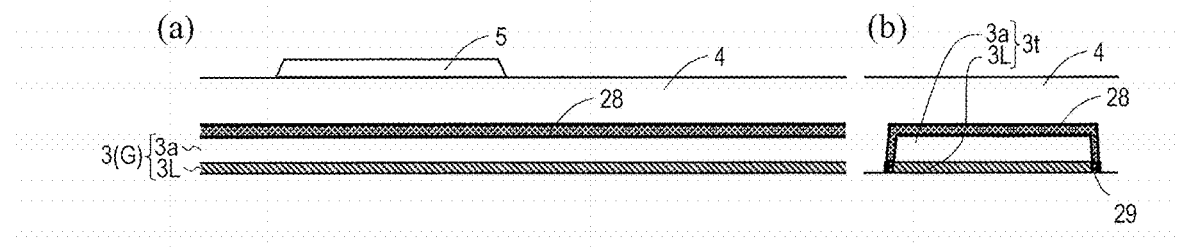

SEMICONDUCTOR DEVICE AND PRODUCTION METHOD THEREFOR

TECHNICAL FIELD

The present invention relates to a semiconductor device formed by using an oxide semiconductor.

BACKGROUND ART

An active matrix substrate used in a liquid crystal display device, or the like, includes a plurality of gate bus lines (gate lines) extending in the row direction, and a plurality of source bus lines (source lines) extending in the column direction. A switching element such as a thin film transistor (hereinafter "TFT") and a pixel electrode are arranged in each pixel defined by these lines. In recent years, it has been proposed in the art to use, as the switching element, a TFT (hereinafter referred to as an "oxide semiconductor TFT") using an oxide semiconductor layer as the active layer.

Source lines and source and drain electrodes of TFTs are normally formed in the same layer (hereinafter, referred to as a "source wiring layer"). Similarly, gate lines and gate electrodes of TFTs are formed in the same layer (hereinafter, referred to as a "gate wiring layer"). A gate wiring layer may include CS bus lines, CS electrodes, etc. Note that a "wiring layer" as used in the present specification includes a plurality of conductive layers such as electrodes and lines formed by using a common conductive film. Among others, a wiring layer formed by using a metal film is specifically referred to as a "metal wiring layer".

A gate wiring layer and a source wiring layer are typically formed by using a metal material having a low resistance, and the surface thereof has a metallic luster. Therefore, light (visible light) coming from outside to be incident upon the substrate may possibly be reflected at the surface of these wiring layers (hereinafter, referred to as "ambient light reflection"), thereby lowering the display contrast.

In order to address this, according to Patent Document 1, for example, for the purpose of suppressing the reflection at the gate wiring layer, a discolored layer having a smaller reflectance than an Al alloy is formed, on the upper surface of the gate wiring layer made of an Al—Ni alloy, using a discoloration solution (($CH_3$)$_4$NOH and $H_2O$).

On the other hand, in order to accommodate larger screen sizes and higher definitions of liquid crystal display devices, there has been a demand for further reducing the resistance of the lines and electrodes of the active matrix substrate. In view of this, it has been proposed to use Cu (copper), a Cu alloy, or the like, having a lower electric resistance than Al, for the source wiring layer and the gate wiring layer (e.g., Patent Document 2).

CITATION LIST

Patent Literature

[Patent Document No. 1] Japanese Laid-Open Patent Publication No. 2009-145789
[Patent Document No. 2] Japanese Laid-Open Patent Publication No. 2012-243779

SUMMARY OF INVENTION

Technical Problem

As a result of a study, the present inventors found that it is difficult to apply the discoloration treatment described in Patent Document 1 to the Cu or Cu alloy surface.

Thus, with conventional active matrix substrates, it is difficult to suppress ambient light reflection at a metal wiring layer formed by using Cu, a Cu alloy, or the like.

In view of such a problem, an embodiment of the present invention has an object to provide a semiconductor device including an oxide semiconductor TFT, with which it is possible to suppress reflection of light at the surface of a metal wiring layer.

Solution to Problem

A semiconductor device according to one embodiment of the present invention includes: a substrate; a thin film transistor supported on the substrate, an active layer of the thin film transistor being an oxide semiconductor layer; at least one metal wiring layer including copper supported on the substrate; a metal oxide film including copper arranged on an upper surface of the at least one metal wiring layer; an insulating layer covering the at least one metal wiring layer with the metal oxide film interposed therebetween; and a conductive layer in direct contact with a part of the at least one metal wiring layer, in an opening formed in the insulating layer, without the metal oxide film interposed therebetween.

In one embodiment, a thickness of the metal oxide film is 20 nm or more and 100 nm or less.

In one embodiment, the at least one metal wiring layer includes a copper layer, and the metal oxide film is a copper oxide film.

In one embodiment, the at least one metal wiring layer includes a copper alloy layer; the copper alloy layer contains copper and at least one metal element other than copper; and the metal oxide film includes copper and the at least one metal element.

In one embodiment, the upper surface of the at least one metal wiring layer, except for a portion thereof that is in contact with the conductive layer, is covered by the metal oxide film.

In one embodiment, the at least one metal wiring layer includes a plurality of metal layers formed from the same metal film; and the metal oxide film is arranged on upper surfaces and side surfaces of the plurality of metal layers.

In one embodiment, the at least one metal wiring layer includes a source wiring layer; the source wiring layer includes a source electrode and a drain electrode of the thin film transistor, and a source line electrically connected to the source electrode; and the conductive layer is in direct contact with the drain electrode in the opening.

In one embodiment, the at least one metal wiring layer includes a gate wiring layer; and the gate wiring layer includes a gate electrode of the thin film transistor and a gate line electrically connected to the gate electrode.

In one embodiment, the semiconductor device further includes another metal wiring layer separate from the at least one metal wiring layer; and an upper surface of the other metal wiring layer is covered by another metal oxide film including copper, and a side surface or a lower surface thereof is in direct contact with another conductive layer.

In one embodiment, the thin film transistor has a channel-etched structure.

In one embodiment, the oxide semiconductor layer includes an In—Ga—Zn—O— based semiconductor.

In one embodiment, the oxide semiconductor layer includes a crystalline portion.

A method according to one embodiment of the present invention is a method for manufacturing a semiconductor device including a substrate, and a thin film transistor formed on the substrate, an active layer of the thin film transistor being an oxide semiconductor layer, the method including: a step (A) of forming a metal film including copper on the substrate and patterning the metal film, thereby obtaining at least one metal wiring layer; a step (B) of forming a metal oxide film including copper on an upper surface of the at least one metal wiring layer; a step (C) of forming an insulating layer so as to cover the at least one metal wiring layer; a step (D) of providing an opening in the insulating layer, thereby exposing a portion of the upper surface of the at least one metal wiring layer on a bottom surface of the opening; and a step (E) of forming a conductive layer so as to be in contact with a portion of the upper surface of the at least one metal wiring layer in the opening.

In one embodiment, the step (B) is a step of performing an oxidation treatment, thereby oxidizing a surface of the at least one metal wiring layer and forming the metal oxide film.

In one embodiment, the step (B) is a step of forming the metal oxide film on the at least one metal wiring layer using a sputtering method.

In one embodiment, the step (D) includes: a step of providing the opening in the insulating layer, thereby exposing the metal oxide film; and a step of removing the exposed portion of the metal oxide film using chelate cleaning, thereby exposing a portion of the upper surface of the at least one metal wiring layer.

In one embodiment, the at least one metal wiring layer includes a source wiring layer.

In one embodiment, the method further includes, before the step (A), a step of forming an oxide semiconductor layer to be the active layer of the thin film transistor; and in the step (B), an oxidation treatment is performed, thereby increasing an oxygen concentration of a surface of at least a portion of the oxide semiconductor layer that is to be a channel region and oxidizing a surface of the source wiring layer to form the metal oxide film.

In one embodiment, the at least one metal wiring layer includes a gate wiring layer.

In one embodiment, the method further includes a step of forming another metal wiring layer; and a lower surface or a side surface of the other metal wiring layer is in contact with another conductive layer, and an upper surface of the other metal wiring layer is covered by another metal oxide film including copper.

Advantageous Effects of Invention

According to an embodiment of the present invention, it is possible to provide a semiconductor device including an oxide semiconductor TFT, with which it is possible to suppress reflection, at the surface of a metal wiring layer, of light coming from outside to be incident upon the semiconductor device, while further suppressing the electric resistance of the electrodes and lines. Thus, it is possible to suppress the lowering of the display quality, e.g., lowering of the display contrast, due to the reflection of incident light coming from outside.

BRIEF DESCRIPTION OF DRAWINGS

FIGS. 2 (*a*) and (*b*) are a cross-sectional view and a plan view, respectively, illustrating a gate terminal portion 110.

FIGS. 4 (*a*) and (*b*) are cross-sectional views of a process step showing a TFT formation region and a gate terminal portion formation region, illustrating an example method for manufacturing the semiconductor device 100B.

FIGS. 5 (*a*) and (*b*) are cross-sectional views of a process step showing a TFT formation region and a gate terminal portion formation region, illustrating an example method for manufacturing the semiconductor device 100B, and (*c*) and (*d*) are plan views corresponding to (a) and (b), respectively.

FIGS. 6 (*a*) and (*b*) are cross-sectional views of a process step showing a TFT formation region and a gate terminal portion formation region, illustrating an example method for manufacturing the semiconductor device 100B.

FIGS. 14 (*a*) and (*b*) are cross-sectional views showing a portion of a pixel and a gate terminal portion 210, respectively, of a semiconductor device 200 of a second embodiment.

FIGS. 15 (*a*) and (*b*) are cross-sectional views of a process step showing a TFT formation region and a gate terminal portion formation region, illustrating an example method for manufacturing the semiconductor device 200.

FIGS. 16 (*a*) and (*b*) are cross-sectional views of a process step showing a TFT formation region and a gate terminal portion formation region, illustrating an example method for manufacturing the semiconductor device 200.

DESCRIPTION OF EMBODIMENTS

Figure 1:
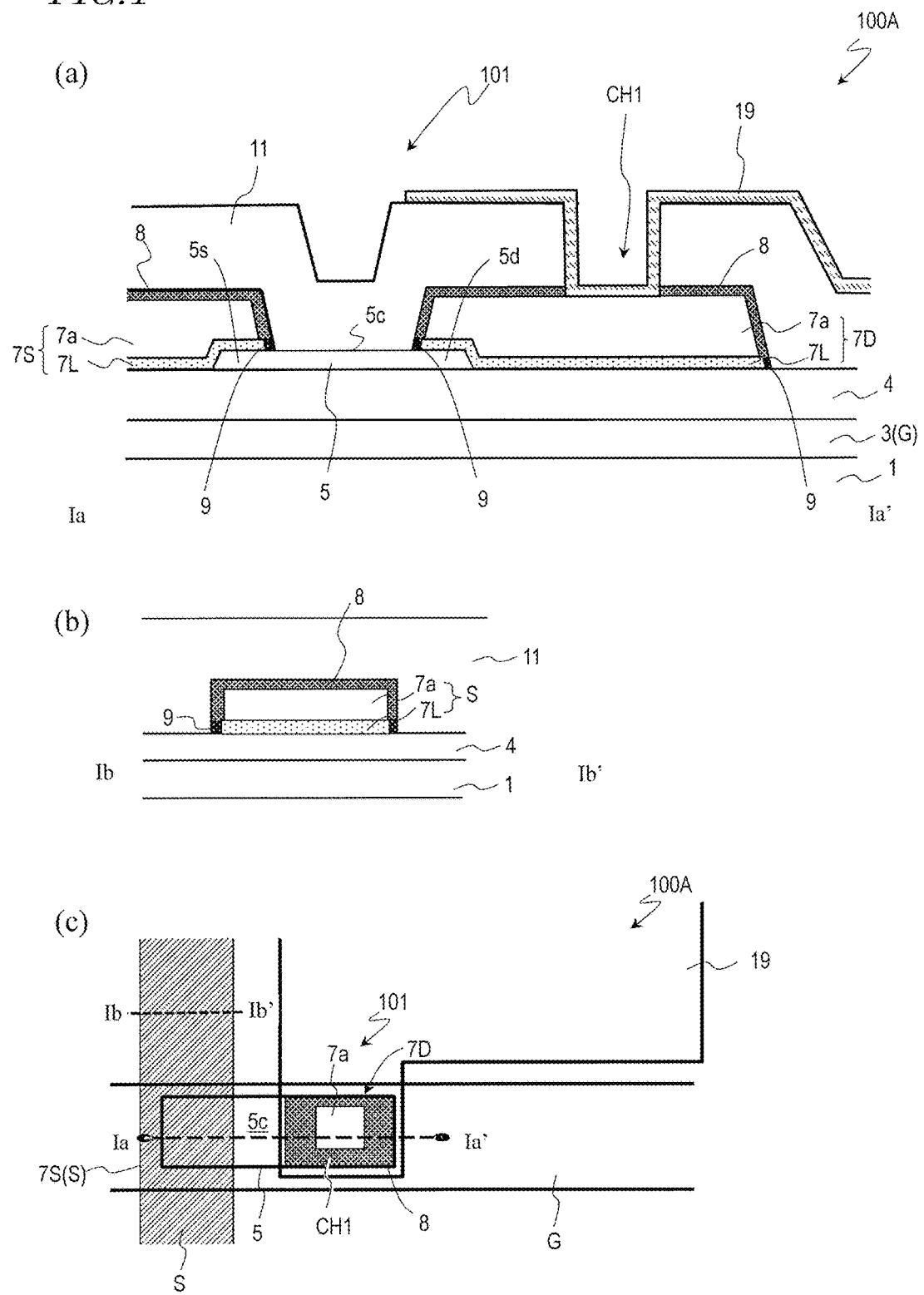
FIGS. 1 (*a*) and (*b*) are schematic cross-sectional views of a semiconductor device 100A of a first embodiment, and (*c*) is a schematic plan view of the semiconductor device 100A.

One embodiment of the present invention will now be outlined below.

A semiconductor device according to one embodiment of the present invention includes a substrate, an oxide semiconductor TFT supported on the substrate, a metal wiring layer including copper (hereinafter, referred to as a "copper-containing metal wiring layer"), an insulating layer, and a conductive layer electrically connected to a portion of the metal wiring layer.

The copper-containing metal wiring layer may include a copper layer or a copper alloy layer, for example. A metal oxide film including copper (hereinafter, referred to as a "copper-containing metal oxide film") is formed on the upper surface of the copper-containing metal wiring layer. The copper-containing metal oxide film includes a copper oxide ($CuO$, $Cu_2O$), for example. It may include another metal oxide in addition to a copper oxide.

The insulating layer is arranged so as to cover the copper-containing metal wiring layer with the copper-containing metal oxide film interposed therebetween. An opening is provided over a portion of the copper-containing metal wiring layer. In the opening formed in the insulating layer, the conductive layer is in direct contact with a portion of the copper-containing metal wiring layer without the copper-containing metal oxide film interposed therebetween.

With the configuration described above, since the copper-containing metal oxide film is formed on the upper surface (metal surface) of the copper-containing metal wiring layer, it is possible to suppress reflection, at the metal surface, of incident light coming from outside the semiconductor device (ambient light reflection). Therefore, it is possible to suppress the lowering of the display contrast due to light reflected by the metal surface and to improve the display quality. Since the copper-containing metal oxide film is not present interposed at the contact portion between the copper-containing metal wiring layer and the conductive layer, it is possible to suppress an increase in the electric resistance of the contact portion.

The copper-containing metal wiring layer typically includes a plurality of metal layers (including electrodes and lines) obtained by patterning the same metal film. In the present embodiment, the copper-containing metal oxide film does not need to be formed on the upper surfaces of all of the metal layers included in the copper-containing metal wiring layer. The advantageous effects described above can be realized as long as the copper-containing metal oxide film is formed on the upper surfaces of at least some of the metal layers.

When a plurality of wiring layers are provided on the substrate, it is possible to realize the advantageous effect of suppressing the ambient light reflection while suppressing an increase in the contact resistance as long as at least one of the wiring layers has the structure described above. For example, either or both of the source wiring layer and the gate wiring layer may have the structure described above.

The contact portion may be a contact portion between the transparent conductive layer (pixel electrode) and the drain electrode, a source terminal portion, a gate terminal portion, or the like. When the copper-containing metal wiring layer has a plurality of contact portions, it is only required that at least one of the contact portions has the structure described above.

The "metal oxide film" as used in the present specification refers to an oxide film (thickness: 5 nm or more, for example) that is formed in an oxidation treatment performed on a metal layer or a deposition process such as a sputtering method, for example, and it does not include a natural oxide film produced on a metal surface. Since a natural oxide film is thin (thickness: less than 5 nm, for example), it is difficult to sufficiently lower the reflectance of the metal surface. Since the influence of a natural oxide film on the contact resistance is sufficiently smaller than that of the metal oxide film described above, it is believed that problems such as an increase in the contact resistance are unlikely to occur.

The upper surface of the copper-containing metal wiring layer may be covered by the copper-containing metal oxide film except for a portion that is in contact with the conductive layer. Therefore, it is possible to more reliably suppress ambient light reflection. The copper-containing metal oxide film may be formed not only on the upper surfaces, but also on the side surfaces, of a plurality of metal layers (electrodes and lines) forming the copper-containing metal wiring layer. Thus, it is possible to suppress ambient light reflection occurring at the side surfaces of the metal layers, and it is therefore possible to more effectively suppress the lowering of display characteristics due to ambient light reflection.

There is no particular limitation on the thickness of the copper-containing metal oxide film, but it is 20 nm or more and 100 nm or less, for example. When it is 20 nm or more, it is possible to more effectively reduce the reflection of light at the metal surface. On the other hand, in view of the manufacturing process, the thickness of the copper-containing metal oxide film is preferably 100 nm or less, and more preferably 60 nm or less. For example, with a simple process such as an oxidation treatment performed on the surface of the metal wiring layer, it is difficult to form a metal oxide film having a thickness greater than 100 nm, for example. It is difficult to selectively remove such a thick copper-containing metal oxide film at the contact portion.

The copper-containing metal oxide film may be a film that is formed through oxidization of the surface of the metal wiring layer during the oxidation treatment performed on the channel region of the oxide semiconductor layer or during the oxidation treatment performed as a pre-treatment for forming the insulating layer. Thus, it is possible to form the copper-containing metal oxide film without increasing the number of manufacturing steps.

The semiconductor device of the present embodiment may further include another metal wiring layer including copper. The other metal wiring layer may have a structure in which the upper surface is covered by the copper-containing metal oxide film and at least a portion of the side surface or the lower surface thereof is in direct contact with the conductive layer. Thus, it is possible to more effectively suppress ambient light reflection. Since the lower surface or the side surface of the metal wiring layer becomes the contact surface, it is possible to cover the entire upper surface by the copper-containing metal oxide film and it is possible to further reduce the ambient light reflection.

A semiconductor device according to an embodiment of the present invention will now be described in greater detail, using an active matrix substrate as an example. Note that a semiconductor device according to an embodiment of the present invention is only required to have an oxide semiconductor TFT and a copper-containing metal wiring layer, and it widely includes active matrix substrates, various display devices, electronic devices, etc.

First Embodiment

A first embodiment of a semiconductor device according to the present invention will be described.

A semiconductor device (an active matrix substrate) of the present embodiment has a structure in which the ambient light reflection at the source wiring layer is suppressed.

FIGS. 1(a) and 1(b) are schematic cross-sectional views of a semiconductor device 100A, and FIG. 1(c) is a schematic plan view of the semiconductor device 100A. FIGS. 1(a) and 1(b) show cross sections taken along lines Ia-Ia' and Ib-Ib', respectively, of FIG. 1(c).

The semiconductor device 100A includes a display region that contributes to display, and a peripheral region (bezel region) located outside the display region. The semiconductor device 100A is applicable to display devices of vertical electric field drive schemes such as the VA mode, for example.

As shown in FIG. 1(c), a plurality of gate lines G and a plurality of source lines S are formed in the display region, and each region delimited by these lines is a "pixel". A plurality of pixels are arranged in a matrix pattern. A transparent conductive layer (pixel electrode) 19 is formed in each pixel. The pixel electrode 19 is separated for each pixel. In each pixel, an oxide semiconductor TFT 101 is arranged in the vicinity of the intersection between the source line S and the gate line G. A drain electrode 7D of the oxide semiconductor TFT 101 is electrically connected to the corresponding pixel electrode 19.

The oxide semiconductor TFT 101 is a channel-etched TFT, for example. The oxide semiconductor TFT 101 includes a gate electrode 3 supported on a substrate 1, a gate insulating layer 4 covering the gate electrode 3, an oxide semiconductor layer 5 arranged so as to be laid over the gate electrode 3 with the gate insulating layer 4 interposed therebetween, and a source electrode 7S and the drain electrode 7D. The source electrode 7S and the drain electrode 7D (which may be referred to simply as "the source/drain electrode 7") is each arranged so as to be in contact with the upper surface of the oxide semiconductor layer 5.

The oxide semiconductor layer 5 includes a channel region 5c, and a source contact region 5s and a drain contact region 5d located on the opposite sides of the channel region 5c. The source electrode 7S is formed so as to be in contact with the source contact region 5s, and the drain electrode 7D is formed so as to be in contact with the drain contact region 5d.

In the present embodiment, a layer that is formed by using the same metal film as the source lines S is referred to as the source wiring layer. The source wiring layer includes the source/drain electrode 7. A layer that is formed by using the same metal film as the gate lines G is referred to as the gate wiring layer. The gate wiring layer may include the gate electrode 3, a storage capacitor line (not shown), etc.

The source wiring layer includes a Cu-containing main layer 7a. The main layer 7a is preferably a layer whose main component is Cu. The Cu content of the main layer 7a may be 90% or more, for example. Preferably, the main layer 7a is a pure Cu layer (Cu content: 99.99% or more, for example). Thus, it is possible to further suppress the electric resistance of the source line S. The main layer 7a may be a Cu layer or a Cu alloy layer (e.g., CuCa alloy layer).

A copper-containing metal oxide film 8 is formed on the upper surface of the source wiring layer. The copper-containing metal oxide film 8 may be in contact with the upper surface of the source wiring layer. The copper-containing metal oxide film 8 includes a copper oxide, for example. When the main layer 7a is a Cu layer, the copper-containing metal oxide film 8 may be a Cu oxide film that is formed through oxidization of the surface of the Cu layer.

In the illustrated example, the source wiring layer has a layered structure including the main layer (e.g., a Cu layer) 7a and a lower layer (e.g., a Ti layer) 7L arranged on the substrate 1 side of the main layer 7a. The copper-containing metal oxide film (e.g., a Cu oxide film) 8 is formed not only on the upper surface of the main layer 7a of the source wiring layer but also on the side surface thereof. An oxide film (e.g., a Ti oxide film) 9 of a metal included in the lower layer is formed on the side surface of the lower layer 7L. The copper-containing metal oxide film 8 and the metal oxide film 9 may be oxide films that are formed through oxidization of the exposed surface of the source wiring layer during the oxidation treatment performed on the oxide semiconductor layer 5.

The oxide semiconductor TFT 101 and the source wiring layer are covered by the interlayer insulating layer 11. The interlayer insulating layer 11 is arranged so as to cover the source electrode 7S, the drain electrode 7D and the source line S with the copper-containing metal oxide film 8 interposed therebetween. In this example, the interlayer insulating layer 11 is arranged so as to be in contact with the channel region 5c of the oxide semiconductor layer 5 and the copper-containing metal oxide film 8. A contact hole CH1 that reaches the surface of the drain electrode 7D (herein, the surface of the main layer 7a) is formed in the interlayer insulating layer 11. As seen from the direction normal to the substrate 1, the copper-containing metal oxide film 8 is not arranged on the bottom surface of the contact hole CH1, and the surface of the drain electrode 7D is exposed.

The pixel electrode 19 is provided on the interlayer insulating layer 11 and in the contact hole CH1. In the contact hole CH1, the pixel electrode 19 is in direct contact with the drain electrode 7D (herein, the main layer 7a) without the copper-containing metal oxide film 8 interposed therebetween.

The following advantageous effects will be realized by the present embodiment.

With the semiconductor device 100A, the copper-containing metal oxide film 8 is arranged on the upper surface of the source wiring layer, and the interlayer insulating layer 11 covers the source wiring layer with the copper-containing metal oxide film 8 interposed therebetween. Thus, it is possible to suppress reflection, at the upper surface of the source wiring layer, of incident light coming from outside.

At the contact portion between the source wiring layer and the conductive layer (e.g., the contact portion between the pixel electrode 19 and the drain electrode 7D), a portion of the source wiring layer and another conductive layer can be brought into direct contact with each other without the copper-containing metal oxide film 8 interposed therebetween. With such a structure, it is possible to suppress the contact resistance.

The copper-containing metal oxide film 8 may be an oxide film that is formed through oxidization of the surface of the source wiring layer during the oxidation treatment performed on the oxide semiconductor layer 5. Thus, it is possible to form the copper-containing metal oxide film 8 so as to cover the upper surface and the side surface of the source wiring layer without increasing the number of manufacturing steps. Depending on the conditions of the oxidation treatment, it is possible to easily obtain the copper-containing metal oxide film 8 having a desired thickness.

There is no particular limitation on the thickness (average thickness) of the copper-containing metal oxide film 8, which varies depending on the composition of the surface of the source/drain electrode 7, the oxidation treatment method and conditions thereof, etc., but it may be 20 nm or more and 100 nm, for example. As an example, when the Cu layer is oxidized by an $N_2O$ plasma treatment (e.g., $N_2O$ gas flow rate: 3000 sccm, pressure: 100 Pa, plasma power density: 1 W/cm$^2$, process time: 200 to 300 sec, substrate temperature: 200° C.), the copper-containing metal oxide film 8 having a thickness of 20 nm or more and 60 nm or less, for example, is formed.

Note that there is no particular limitation on the method of formation of the copper-containing metal oxide film 8. The copper-containing metal oxide film 8 may be a film formed on the main layer 7a by a deposition process such as a sputtering method.

A portion of the copper-containing metal oxide film 8 that is located on the bottom surface of the contact hole CH1 is preferably removed by chelate cleaning. The copper-containing metal oxide film 8 is formed on the surface of the main layer (Cu layer) 7a through an oxidation treatment such as an $N_2O$ plasma treatment, for example.

The thickness of the copper-containing metal oxide film 8 formed by the oxidation treatment is likely to vary. Irregularities may be produced on the surface of the main layer (Cu layer) 7a. Even in such a case, chelate cleaning removes not only the copper-containing metal oxide film 8 but also the surface portion of the main layer 7a in the contact hole CH1, thereby advantageously flattening the surface of the main layer 7a. As a result, the interface between the main layer 7a and the pixel electrode 19 in the contact portion is flatter than the interface between the main layer 7a and the interlayer insulating layer 11 (i.e., the interface between the main layer 7a and the interlayer insulating layer 11 with the copper-containing metal oxide film 8 interposed therebetween). Thus, it is possible to more significantly reduce the contact resistance between the drain electrode 7D and the pixel electrode 19. Since it is possible to reduce the variations of the contact resistance across the substrate 1, it is possible to increase the reliability. Moreover, it is possible to more effectively increase the adhesion of the pixel electrode 19 to the drain electrode 7D.

Note that when a portion of the surface of the source wiring layer that is located on the bottom surface of the contact hole CH1 is flattened by chelate cleaning, it may be located below the other portion that is covered by the copper-containing metal oxide film 8. When the copper-containing metal oxide film 8 is removed by chelate cleaning, the etching of the copper-containing metal oxide film 8 may also proceed in the lateral direction (side etch). In such a case, as seen from the direction normal to the substrate 1, the edge portion of the copper-containing metal oxide film 8 is located on the outer side with respect to the outline of the contact hole CH1 (the edge portion of the interlayer insulating layer 11).

<Terminal Portion>

The semiconductor device 100A may include a source terminal portion and a gate terminal portion in the non-display region (peripheral area). For example, the source terminal portion has a structure in which a source connection layer formed integral with the source lines S and an upper conductive layer formed from the same film as the pixel electrode 19 are connected together in a contact hole provided in the interlayer insulating layer 11. It is preferred that in the source terminal portion, the copper-containing metal oxide film 8 formed on the upper surface of the source connection layer is removed in the contact hole of the interlayer insulating layer 11, and the source connection layer and the upper conductive layer are in direct contact with each other in the contact hole of the interlayer insulating layer 11. The gate terminal portion has a structure in which a gate connection layer formed integral with the gate lines G and an upper conductive layer formed from the same film as the pixel electrode 19 are connected together. In the gate terminal portion, in the contact hole provided in the gate insulating layer 4 and the interlayer insulating layer 11, the gate connection layer and the upper conductive layer may be connected together via the source connection layer formed from the same film as the source lines S.

The structure of a terminal portion will now be described using a gate terminal portion as an example. FIGS. 2(a) and 2(b) are a cross-sectional view and a plan view, respectively, illustrating a gate terminal portion. Like elements to those of FIG. 1 are denoted by like reference signs. FIG. 2(a) shows a cross section taken along line II-II' of FIG. 2(b).

A gate terminal portion 110 includes a gate connection portion 3t formed on the substrate 1, the gate insulating layer 4 provided extending over the gate connection portion 3t, a source connection portion 7t, the interlayer insulating layer 11 provided extending over the source connection portion 7t, and the upper conductive layer 19t. The source connection portion 7t is formed from the same conductive film as the source lines S and is electrically separated from the source lines S. The source connection portion 7t is arranged so as to be in contact with the gate connection portion 3t in the opening provided in the gate insulating layer 4. The upper conductive layer 19t is arranged so as to be in contact with the source connection portion 7t in the contact hole CH2 provided in the interlayer insulating layer 11. A portion of the upper surface of the source connection portion 7t is covered by the copper-containing metal oxide film 8.

In this example, the source connection portion 7t includes the Cu-containing main layer (e.g., a Cu layer) 7a, and the lower layer (e.g., a Ti layer) 7L located on the substrate 1 side of the main layer 7a. The copper-containing metal oxide film 8 (e.g., a Cu oxide film) is formed on the upper surface and the side surface of the main layer 7a of the source connection portion 7t. The metal oxide film (e.g., a Ti oxide film) 9 is formed on the side surface of the lower layer 7L.

In the contact hole CH2, the copper-containing metal oxide film 8 is removed, and the upper conductive layer 19t and the upper surface (Cu surface) of the source connection portion 7t are in direct contact with each other. That is, the copper-containing metal oxide film 8 is present interposed between the source connection portion 7t and the interlayer insulating layer 11, and is not present interposed between the source connection portion 7t pixel and the upper conductive layer 19t. Thus, it is possible to suppress the contact resistance between the gate connection portion 3t and the upper conductive layer 19t.

<Semiconductor Device Having Two-Layer Electrode Structure>

The semiconductor device of the present embodiment may further include another electrode layer that functions as a common electrode on the pixel electrode 19 or between the interlayer insulating layer 11 and the pixel electrode 19. Thus, a semiconductor device having two transparent electrode layers is obtained. Such a semiconductor device is applicable to display devices of the FFS mode, for example.

Figure 3:
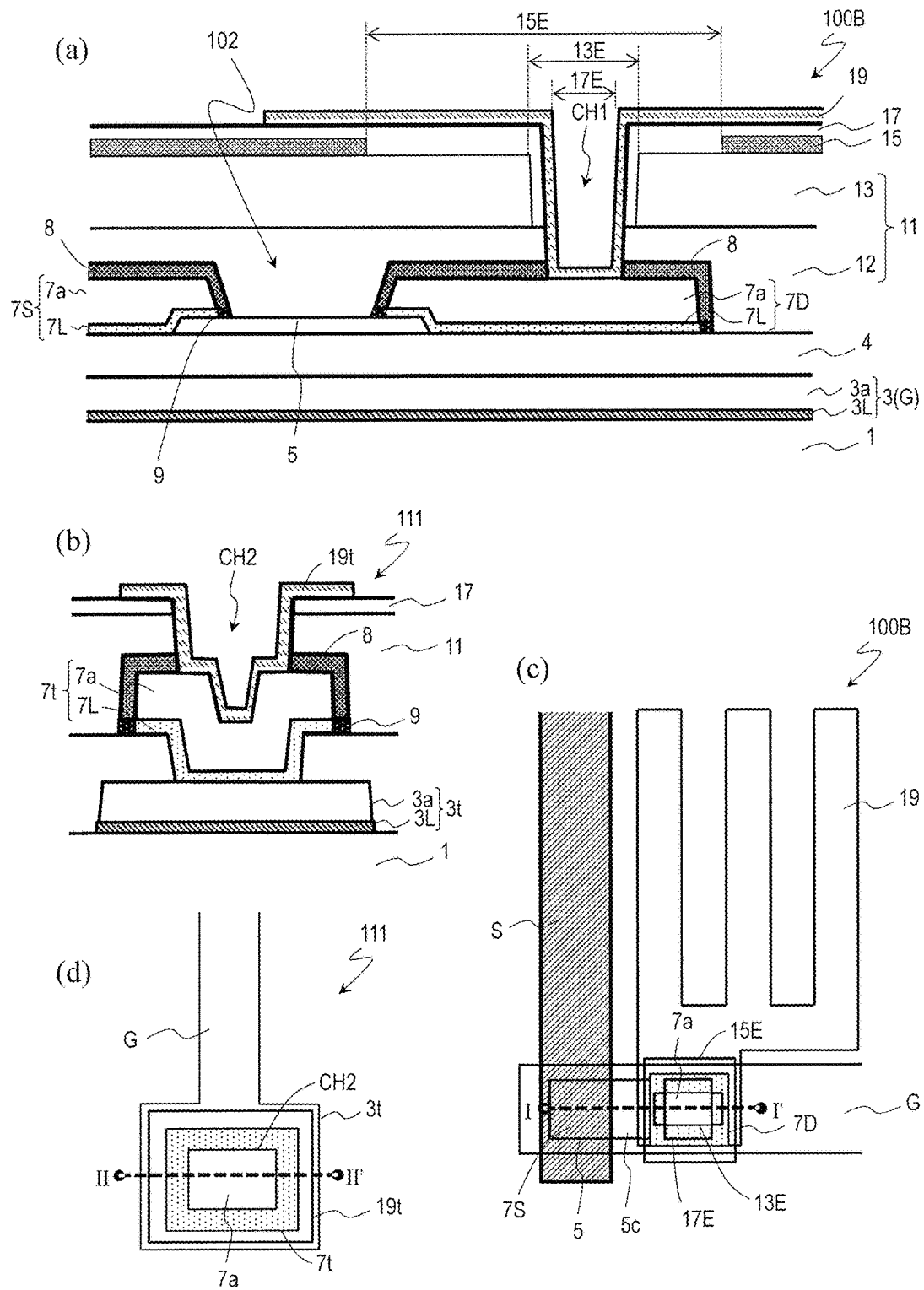
FIGS. 3 (*a*) and (*b*) are cross-sectional views showing a portion of a pixel and a gate terminal portion 111, respectively, of another semiconductor device 100B of the first embodiment, (*c*) and (*d*) are plan views illustrating a portion of a pixel and the gate terminal portion 111, respectively, of the semiconductor device 100B.
Figure 7:
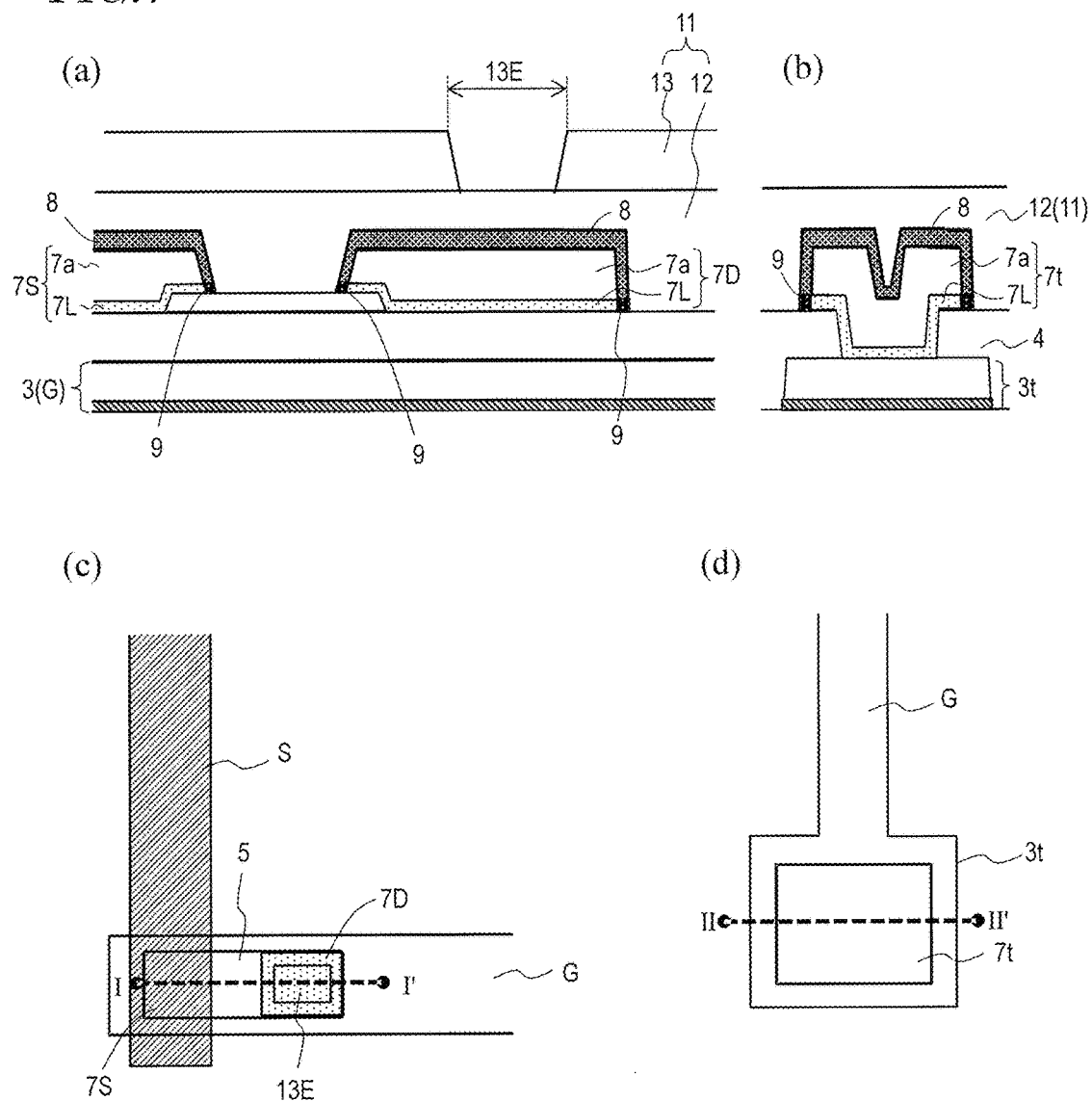
FIGS. 7 (*a*) and (*b*) are cross-sectional views of a process step showing a TFT formation region and a gate terminal portion formation region, illustrating an example method for manufacturing the semiconductor device 100B, and (*c*) and (*d*) are plan views corresponding to (a) and (b), respectively.
Figure 8:
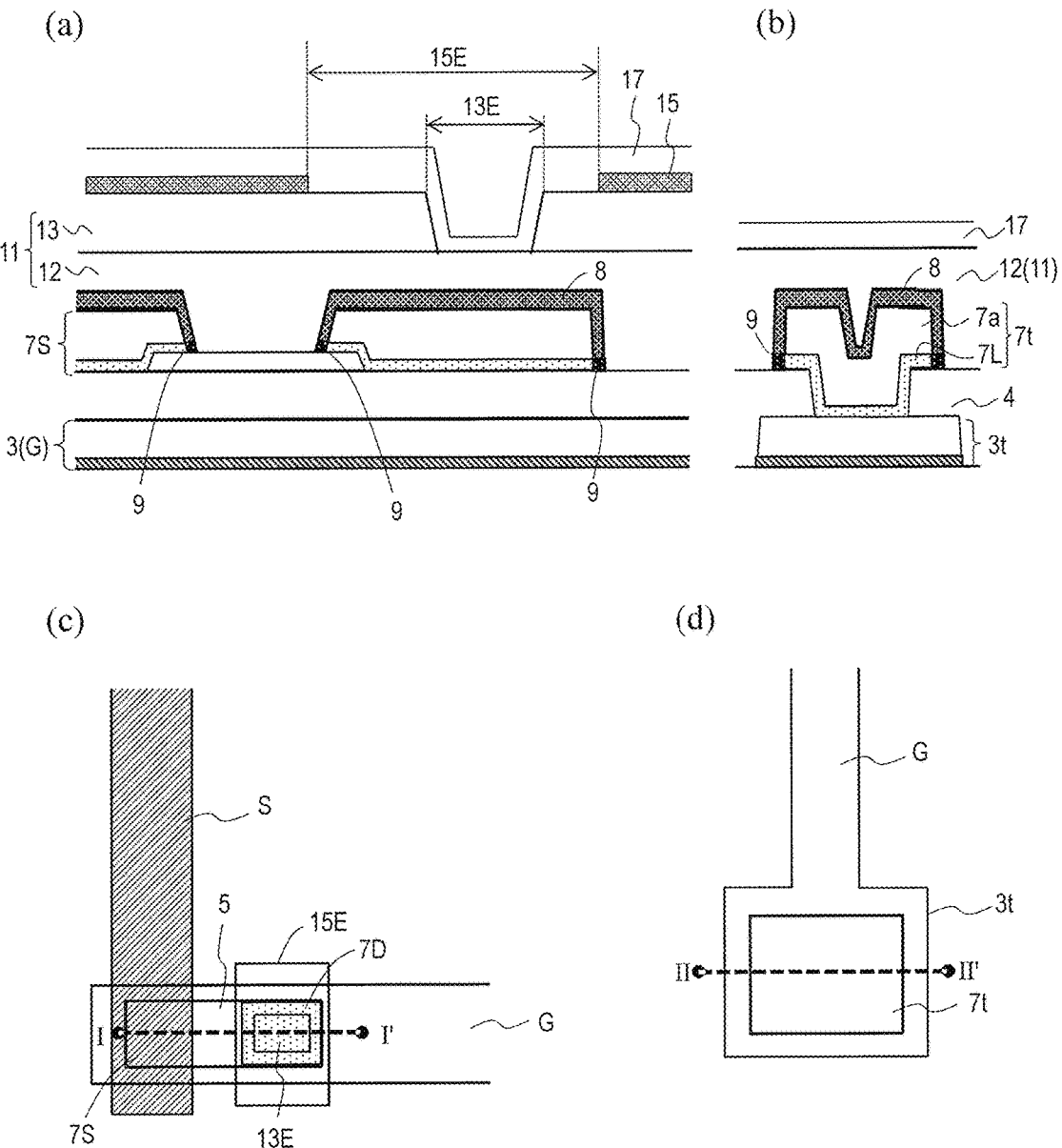
FIGS. 8 (*a*) and (*b*) are cross-sectional views of a process step showing a TFT formation region and a gate terminal portion formation region, illustrating an example method for manufacturing the semiconductor device 100B, and (*c*) and (*d*) are plan views corresponding to (a) and (b), respectively.
Figure 9:
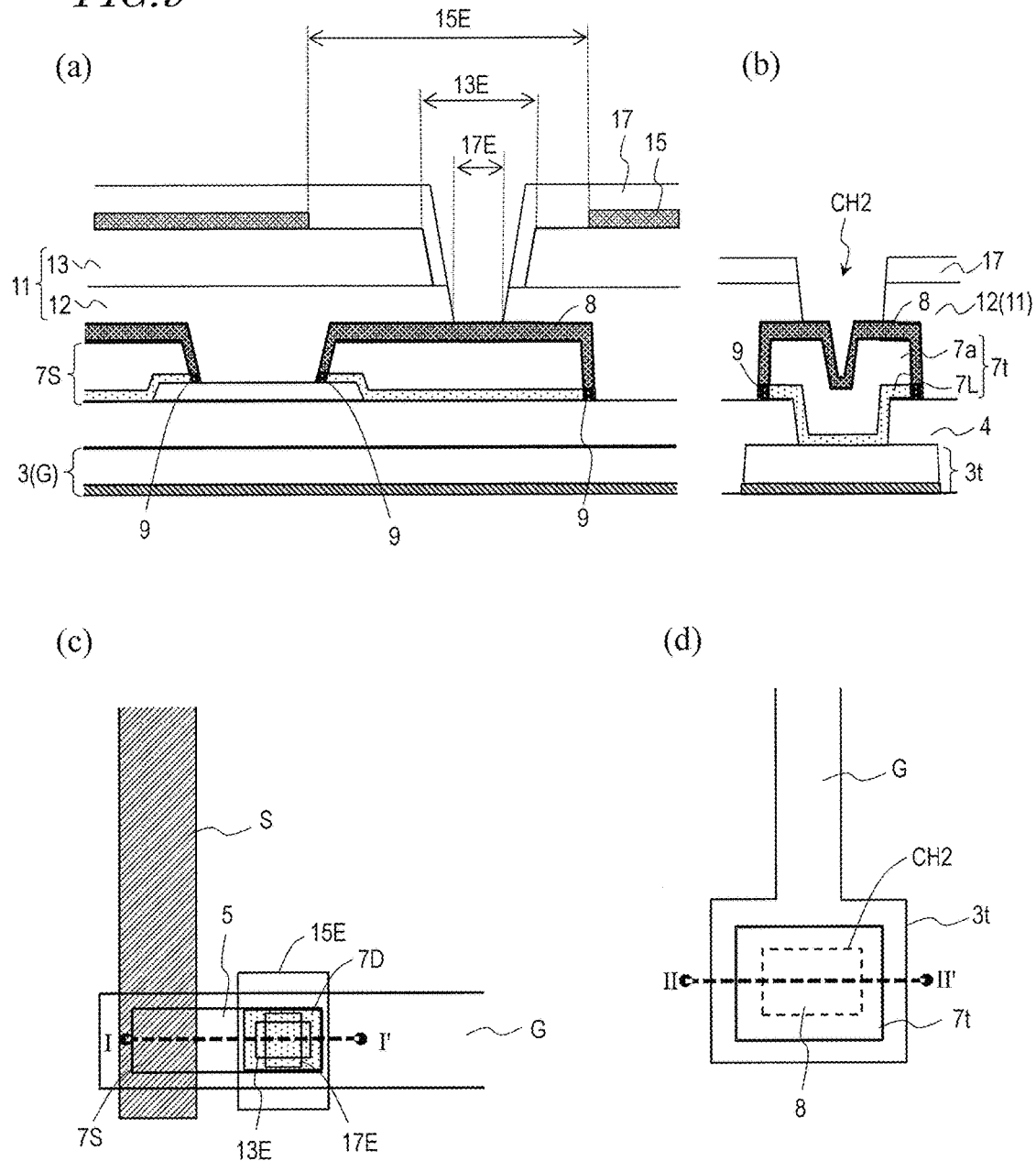
FIGS. 9 (*a*) and (*b*) are cross-sectional views of a process step showing a TFT formation region and a gate terminal portion formation region, illustrating an example method for manufacturing the semiconductor device 100B, and (*c*) and (*d*) are plan views corresponding to (a) and (b), respectively.
Figure 10:
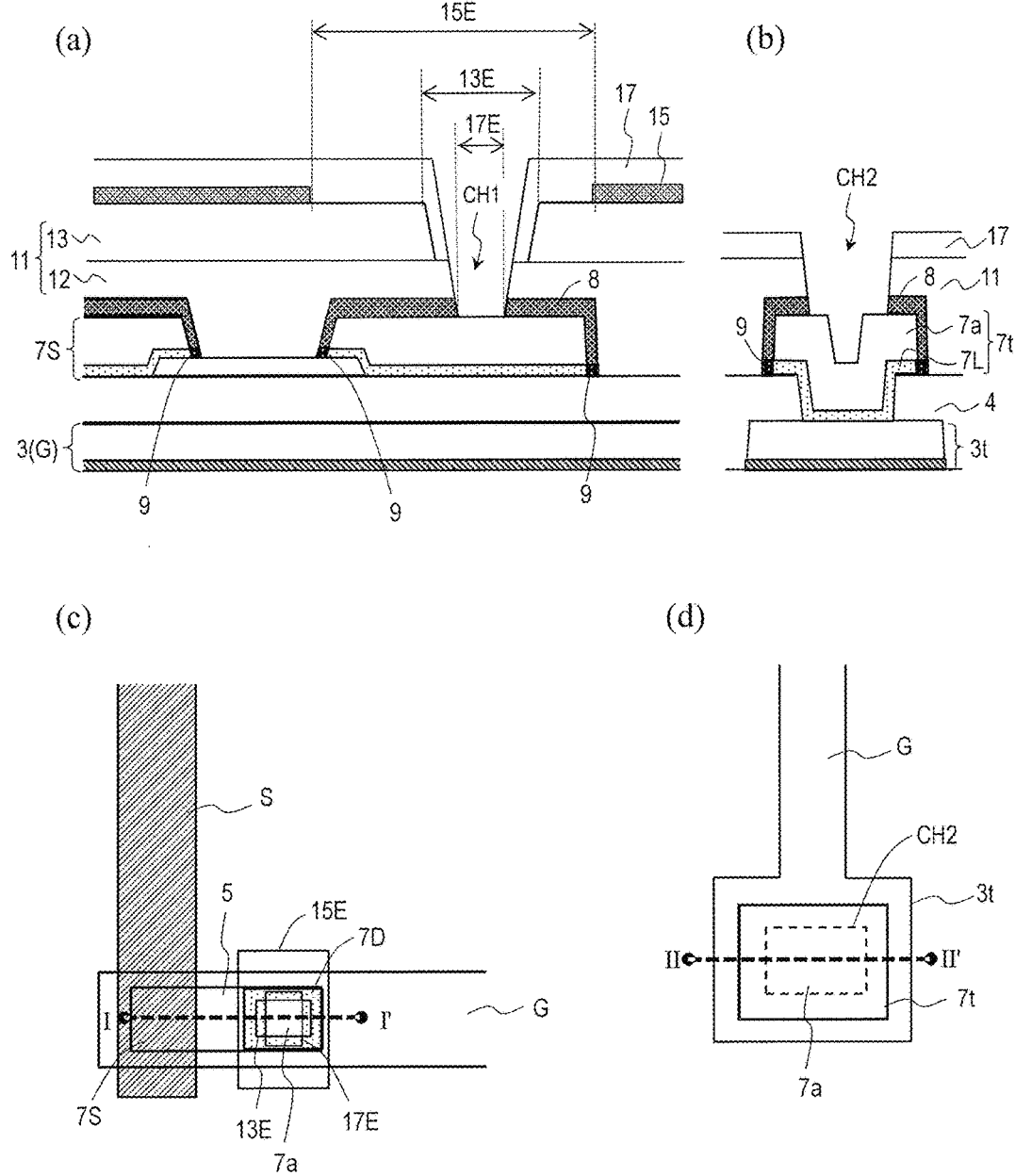
FIGS. 10 (*a*) and (*b*) are cross-sectional views of a process step showing a TFT formation region and a gate terminal portion formation region, illustrating an example method for manufacturing the semiconductor device 100B, and (*c*) and (*d*) are plan views corresponding to (a) and (b), respectively.

Next, referring to FIGS. 3(a) to 3(d), another semiconductor device (active matrix substrate) 100B of the present embodiment will be described. FIGS. 3(a) and 3(b) are cross-sectional views showing a portion of a pixel and a gate terminal portion 111, respectively, of the semiconductor device 100B. FIGS. 3(c) and 3(d) are plan views showing a portion of a pixel and the gate terminal portion 111, respectively, of the semiconductor device 100B. FIG. 3(a) shows a cross section taken along line I-I' of FIG. 3(c), and FIG. 3(b) shows a cross section taken along line II-II' of FIG. 3(d). In FIG. 3, like elements to those of FIG. 1 and FIG. 2 are denoted by like reference signs and will not be discussed below.

The semiconductor device 100B is different from the semiconductor device 100A shown in FIG. 1 in that a common electrode 15 is provided so as to oppose the pixel electrode 19 between the interlayer insulating layer 11 and the transparent conductive layer (pixel electrode) 19. A third insulating layer 17 is formed between the common electrode 15 and the pixel electrode 19.

A common signal (COM signal) is applied to the common electrode 15. The common electrode 15 has the opening 15E for each pixel, and a contact portion between the pixel electrode 19 and the drain electrode 7D of the oxide semiconductor TFT 101 may be formed in the opening 15E. In this example, the pixel electrode 19 and the drain electrode 7D (the main layer 7a) are in direct contact with each other in the contact hole CH1. The common electrode 15 may be formed generally across the entirety of the display region (excluding the openings 15E described above).

With the semiconductor device 100B, the gate wiring layer including the gate electrode 3 and the gate lines G has a layered structure including a main layer 3a and a lower layer 3L located on the substrate 1 side of the main layer 7a. The main layer 3a may be a layer having a lower resistance than the lower layer 3L.

The interlayer insulating layer 11 may include the first insulating layer 12 in contact with the oxide semiconductor layer 5 and the second insulating layer 13 formed on the first insulating layer 12. The first insulating layer 12 may be an inorganic insulating layer, and the second insulating layer 13 may be an organic insulating layer.

The configuration of a semiconductor device having two transparent electrode layers is not limited to that shown in FIG. 3. For example, the pixel electrode 19 and the drain electrode 7D may be connected together via a transparent connection layer formed from the same transparent conductive film as the common electrode 15. In such a case, in the contact hole CH1, the transparent connection layer is arranged so as to be in direct contact with the main layer 7a of the drain electrode 7D. Although FIG. 3 shows an example in which the common electrode 15 is formed between the interlayer insulating layer 11 and the pixel electrode 19, the common electrode 15 may be formed on the pixel electrode 19 with the third insulating layer 17 interposed therebetween.

The semiconductor device 100B is applicable to display devices of the FFS mode, for example. In such a case, each pixel electrode 19 preferably includes a plurality of slit-shaped openings or slit portions. On the other hand, when the common electrode 15 is arranged at least under the slit-shaped openings or slit portions of the pixel electrode 19, the common electrode 15 can function as a counter electrode for the pixel electrode, thereby applying a transverse electric field through the liquid crystal molecules.

As seen from the direction normal to the substrate 1, at least a portion of the pixel electrode 19 may be laid over the common electrode 15 with the third insulating layer 17 interposed therebetween. Thus, a capacitor using the third insulating layer 17 as a dielectric layer is formed in an area where the pixel electrode 19 and the common electrode 15 are laid over each other. This capacitor can function as a storage capacitor (transparent storage capacitor) of the display device. A storage capacitor having a desired capacitance is obtained by appropriately adjusting the material and the thickness of the third insulating layer 17, the area of the portion forming the capacitor, etc. Therefore, there is no need to separately form a storage capacitor by using the same metal film as that of the source line, for example, in the pixel. Therefore, it is possible to suppress the lowering of the aperture ratio due to the formation of a storage capacitor using a metal film. The common electrode 15 may account for generally the entirety of the pixel (excluding the opening 15E). Thus, it is possible to increase the area of the storage capacitor.

Note that instead of the common electrode 15, a transparent conductive layer that opposes the pixel electrode 19 and functions as a storage capacitor electrode may be provided, forming a transparent storage capacitor in the pixel. Such a semiconductor device is applicable also to display devices of operation modes other than the FFS mode.

<Manufacturing Method>

An example method for manufacturing a semiconductor device of the present embodiment will now be described, using a method for manufacturing the semiconductor device 100B as an example, with reference to the drawings.

FIG. 4 to FIG. 10 are cross-sectional views of process steps illustrating an example method for manufacturing the semiconductor device 100B, wherein (a) and (b) are cross-sectional views showing the TFT formation region and the gate terminal portion formation region, taken along lines I-I' and II-II' of FIG. 3, respectively. In FIG. 5, FIG. 7 to FIG. 10, (c) and (d) are plan views showing the TFT formation region and the gate terminal portion formation region, respectively.

First, as shown in FIGS. 4(a) and 4(b), a gate wiring layer including the gate electrode 3, the gate connection portion 3t and the gate lines G is formed on the substrate 1. In this example, the gate wiring layer has a layered structure including the Cu-containing main layer 3a and the lower layer 3L arranged on the substrate 1 side of the main layer 3a. The main layer 3a forms the upper surface of the gate wiring layer.

Specifically, first, a gate line metal film (thickness: 50 nm or more and 500 nm or less, for example), not shown, is formed by a sputtering method, or the like, on the substrate (e.g., a glass substrate) 1. Then, the gate line metal film is patterned to obtain the gate wiring layer.

The substrate 1 may be, for example, a glass substrate, a silicon substrate or a heat-resisting plastic substrate (resin substrate).

Note that there is no particular limitation on the material of the gate line metal film. It may suitably be film containing a metal such as aluminum (Al), tungsten (W), molybdenum (Mo), tantalum (Ta), chromium (Cr), titanium (Ti) and copper (Cu), or an alloy thereof, or a metal nitride thereof. The gate line metal film may have a single-layer structure or a layered structure.

Herein, a layered film including the lower layer (thickness: 20 nm or more and 200 nm or less, for example) 3L and the main layer (thickness: 100 nm or more and 400 nm or less, for example) 3a is formed as the gate line metal film. The main layer 3a may be formed from a material having a lower electric resistance than the lower layer 3L. The main layer 3a may or may not include Cu. Preferably, Cu is included as the main component. The main layer 3a may be a Cu layer or a Cu alloy layer, for example. The lower layer 3L may include a metal element such as titanium (Ti) or Mo (molybdenum), though there is no particular limitation on the metal element. Examples of the lower layer 3L include a Ti layer, an Mo layer, a titanium nitride layer and a molybdenum nitride layer. Alternatively, it may be a Ti- or Mo-containing alloy layer. With the provision of the lower layer 3L, it is possible to improve the adhesion to the glass substrate.

Then, as shown in FIGS. 5(*a*) to 5(*d*), the gate insulating layer 4 is formed so as to cover the gate wiring layer, and then the island-shaped oxide semiconductor layer 5 is formed in the TFT formation region.

The gate insulating layer 4 may be formed by a CVD method, or the like. The gate insulating layer 4 may suitably be a silicon oxide ($SiO_2$) layer, a silicon nitride (SiNx) layer, a silicon oxide nitride (SiOxNy; x>y) layer, a silicon nitride oxide (SiNxOy; x>y) layer, or the like. The gate insulating layer 4 may have a layered structure. For example, a silicon nitride layer, a silicon nitride oxide layer, or the like, may be formed on the substrate side (lower layer) in order to prevent the diffusion of impurities, etc., from the substrate 1, while forming a silicon oxide layer, a silicon oxide nitride layer, or the like, as a layer thereon (upper layer) in order to ensure insulation. Note that if an oxygen-containing layer (e.g., an oxide layer such as $SiO_2$) is used as the uppermost layer of the gate insulating layer 4 (i.e., the layer in contact with the oxide semiconductor layer), when oxygen deficiency occurs in the oxide semiconductor layer, the oxygen deficiency can be recovered with oxygen contained in the oxide layer, and it is possible to effectively reduce the oxygen deficiency of the oxide semiconductor layer.

For the oxide semiconductor layer 5, an oxide semiconductor film (thickness: 30 nm or more and 200 nm or less, for example) is formed on the gate insulating layer 4 by using a sputtering method, for example. Then, the oxide semiconductor film is patterned by photolithography, thereby obtaining the oxide semiconductor layer 5. As seen from the direction normal to the substrate 1, at least a portion of the oxide semiconductor layer 5 is arranged so as to be laid over the gate electrode 3 with the gate insulating layer 4 interposed therebetween. Herein, the oxide semiconductor layer 5 is formed by patterning an In—Ga—Zn—O-based amorphous oxide semiconductor film (thickness: 50 nm, for example) including In, Ga and Zn at a ratio of 1:1:1.

The oxide semiconductor included in the oxide semiconductor layer 5 may be an amorphous oxide semiconductor or a crystalline oxide semiconductor having crystalline portions. The crystalline oxide semiconductor may be a polycrystalline oxide semiconductor, a microcrystalline oxide semiconductor, etc. The crystalline oxide semiconductor may be a crystalline oxide semiconductor whose c axis is oriented generally perpendicular to the layer plane.

The oxide semiconductor layer 5 may have a layered structure of two layers or more. When the oxide semiconductor layer 5 has a layered structure, the oxide semiconductor layer 5 may include an amorphous oxide semiconductor layer and a crystalline oxide semiconductor layer. Alternatively, it may include a plurality of crystalline oxide semiconductor layers of different crystalline structures. When the oxide semiconductor layer 5 has a two-layer structure including an upper layer and a lower layer, the energy gap of the oxide semiconductor included in the upper layer is preferably greater than the energy gap of the oxide semiconductor included in the lower layer. Note however that when the difference in energy gap between these layers is relatively small, the energy gap of the oxide semiconductor of the lower layer may be greater than the energy gap of the oxide semiconductor of the upper layer.

The materials, structures, deposition methods of the amorphous oxide semiconductor and the crystalline oxide semiconductors described above, and the configuration of the oxide semiconductor layer having a layered structure are described in Japanese Laid-Open Patent Publication No. 2014-007399. The entire disclosure of Japanese Laid-Open Patent Publication No. 2014-007399 is incorporated herein by reference.

The oxide semiconductor layer 5 may include at least one metal element selected from In, Ga and Zn, for example. In the present embodiment, the oxide semiconductor layer 5 includes an In—Ga—Zn—O-based semiconductor, for example. Herein, the In—Ga—Zn—O-based semiconductor is a ternary oxide of In (indium), Ga (gallium) and Zn (zinc), wherein there is no particular limitation on the ratio (composition ratio) between In, Ga and Zn, and it may be In:Ga:Zn=2:2:1, In:Ga:Zn=1:1:1, In:Ga:Zn=1:1:2, etc., for example. Such an oxide semiconductor layer 5 can be formed from an oxide semiconductor film including an In—Ga—Zn—O-based semiconductor. Note that a channel-etched TFT having an active layer including an In—Ga—Zn—O-based semiconductor may be referred to as a "CE-InGaZnO-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c axis is oriented generally perpendicular to the layer plane.

Note that The crystalline structure of a crystalline In—Ga—Zn—O-based semiconductor is disclosed in Japanese Laid-Open Patent Publication No. 2014-007399, mentioned above, Japanese Laid-Open Patent Publication No. 2012-134475, Japanese Laid-Open Patent Publication No. 2014-209727, etc., for example. The entire disclosure of Japanese Laid-Open Patent Publication No. 2012-134475 and Japanese Laid-Open Patent Publication No. 2014-209727 is incorporated herein by reference. A TFT having an In—Ga—Zn—O-based semiconductor layer has a high mobility (20 times or more that of a-Si TFT) and a low leak current (1/100 or less of that of a-Si TFT), and it can suitably be used as a driving TFT and a pixel TFT.

The oxide semiconductor layer 5 may include another oxide semiconductor, instead of an In—Ga—Zn—O-based semiconductor. For example, it may include an In—Sn—Zn—O-based semiconductor (e.g., $In_2O_3$—$SnO_2$—ZnO). The In—Sn—Zn—O-based semiconductor is a ternary oxide of In (indium), Sn (tin) and Zn (zinc). Alternatively, the oxide semiconductor layer 5 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

In the illustrated example, the oxide semiconductor layer 5 is arranged so that the entirety thereof is laid over the gate electrode (gate line) 3 as seen from the direction normal to the substrate 1, but the arrangement of the oxide semiconductor layer 5 is not limited to this. It is only required that at least a portion (the channel region 5c) of the oxide semiconductor layer 5 is arranged so as to be laid over the gate electrode 3 with the gate insulating layer 4 interposed therebetween.

Then, as shown in FIGS. 6(a) and 6(b), in the gate terminal portion formation region, an opening 4E through which the gate connection portion 3t is exposed is formed in the gate insulating layer 4. Then, the source wiring layer including the source electrode 7S, the drain electrode 7D, the source connection portion 7t and the source lines S is formed. The source electrode 7S and the drain electrode 7D are arranged so as to be in contact with the upper surface of the oxide semiconductor layer 5. The source connection portion 7t is arranged so as to be in contact with the gate connection portion 3t.

In this example, the source wiring layer has a layered structure including the Cu-containing main layer 7a and the lower layer 7L arranged on the substrate 1 side of the main layer 7a. The main layer 7a forms the upper surface of the source wiring layer.

Specifically, first, a source line metal film (thickness: 50 nm or more and 500 nm or less, for example), not shown, is formed by a sputtering method, for example, on the gate insulating layer 4, in the opening 4E and on the oxide semiconductor layer 5. Then, the source line metal film is patterned to obtain the source electrode 7S, the drain electrode 7D, the source connection portion 7t and the source lines S. The source electrode 7S is arranged so as to be in contact with the source contact region of the oxide semiconductor layer 5, and the drain electrode 7D is arranged so as to be in contact with the drain contact region of the oxide semiconductor layer 5. A portion of the oxide semiconductor layer 5 that is located between the source electrode 7S and the drain electrode 7D is to be the channel region 5c. Thus, the oxide semiconductor TFT 101 is obtained.

Herein, as the source line metal film, a layered film is formed including the lower layer 7L and the main layer 7a stacked in this order starting from the side of the oxide semiconductor layer 5. The main layer 7a is a Cu-containing layer, and it may be a Cu layer or a Cu alloy layer, for example. The lower layer 7L may include a metal element such as titanium (Ti) or Mo (molybdenum). Examples of the lower layer 7L include a Ti layer, an Mo layer, a titanium nitride layer and a molybdenum nitride layer. Alternatively, it may be a Ti- or Mo-containing alloy layer.

The thickness of the main layer 7a may be 100 nm or more and 400 nm or less, for example. If it is 100 nm or more, it is possible to form electrodes and lines with a lower resistance. If it is over 400 nm, the coverage of the interlayer insulating layer 11 may lower. Note that the thickness of the main layer 7a upon completion of the finished product is smaller than the thickness of the Cu film upon deposition thereof by the amount that is consumed for the formation of the copper-containing metal oxide film 8 in the oxidation treatment step. Therefore, the thickness upon deposition is preferably set while taking into consideration the amount that is consumed for the formation of the copper-containing metal oxide film 8.

The thickness of the lower layer 7L is preferably smaller than the main layer 7a. Then, the ON resistance can be made small. The thickness of the lower layer 7L may be 20 nm or more and 200 nm or less, for example. When it is 20 nm or more, it is possible to realize an effect of reducing the contact resistance while suppressing the total thickness of the source line metal film. When it is 200 nm or less, it is possible to more effectively reduce the contact resistance between the oxide semiconductor layer 5 and the source/drain electrode 7.

Note that the source wiring layer is only required to include Cu, and it may have a single-layer structure. It may have a layered structure of three layers or more, including a further conductive layer in addition to the main layer 7a and the lower layer 7L.

Then, as shown in FIGS. 7(a) to 7(d), the copper-containing metal oxide film 8 is formed on the upper surface of the source wiring layer. Then, the interlayer insulating layer 11 is formed so as to cover the source wiring layer. The interlayer insulating layer 11 is arranged so as to be in contact with the copper-containing metal oxide film 8 and the channel region 5c.

In the present embodiment, the copper-containing metal oxide film 8 is formed by an oxidation treatment. Specifically, an oxidation treatment is performed on the oxide semiconductor layer 5 and the source wiring layer. This increases the oxygen concentration on the surface of the channel region of the oxide semiconductor layer 5 while oxidizing the surface (exposed surface) of the source wiring layer, forming the copper-containing metal oxide film 8. In this example, the exposed upper surface and side surface of the source electrode 7S, the drain electrode 7D, the source connection portion 7t and the source line S are oxidized. As a result, the copper-containing metal oxide film 8 is formed on the upper surface and the side surface of the main layer 7a. Also, the metal oxide film 9 may be formed on the side surface of the lower layer 7L. When the main layer 7a is a Cu layer and the lower layer 7L is a Ti layer, a Cu oxide film is formed as the copper-containing metal oxide film 8 and a Ti oxide film is formed as the metal oxide film 9. The thickness of the Ti oxide film is smaller than the Cu oxide film.

A plasma treatment using an $N_2O$ gas, for example, may be performed as the oxidation treatment. An $N_2O$ plasma treatment is performed, where $N_2O$ gas flow rate: 3000 sccm, pressure: 100 Pa, plasma power density: 1.0 W/cm2, process time: 200 to 300 sec, substrate temperature: 200° C., for example. Thus, the copper-containing metal oxide film 8 (Cu oxide film) is formed whose thickness (average thickness) is 20 nm, for example.

Note that the oxidation treatment is not limited to a plasma treatment using an $N_2O$ gas. For example, the oxidation treatment may be performed by a plasma treatment using an $O_2$ gas, an ozone treatment, etc., for example. In order to perform the treatment without increasing the number of steps, it is preferably performed immediately before the step of forming the interlayer insulating layer 11. Specifically, an $N_2O$ plasma treatment may be performed when the interlayer insulating layer 11 is formed by a CVD method, and an $O_2$ plasma treatment may be performed when the interlayer insulating layer 11 is formed by a sputtering method. Alternatively, the oxidation treatment may be performed by an $O_2$ plasma treatment using an ashing apparatus.

The interlayer insulating layer 11 includes the first insulating layer 12 in contact with the channel region of the oxide semiconductor layer 5, and the second insulating layer 13 arranged on the first insulating layer 12, for example.

The first insulating layer 12 may be an inorganic insulating layer such as a silicon oxide ($SiO_2$) film, a silicon nitride (SiNx) film, a silicon oxide nitride (SiOxNy; x>y) film, a silicon nitride oxide (SiNxOy; x>y) film, etc., for example. Herein, an $SiO_2$ layer whose thickness is 200 nm, for example, is formed as the first insulating layer 12 by a CVD method, for example.

Although not shown in the figures, a heat treatment (annealing treatment) may be performed on the entire substrate after the formation of the first insulating layer 12 and before the formation of the second insulating layer 13. There is no particular limitation on the temperature of the heat treatment, it may be 250° C. or more and 450° C. or less, for example.

The second insulating layer 13 may be an organic insulating layer, for example. Herein, a positive-type photosensitive resin film whose thickness is 2000 nm, for example, is formed, and the photosensitive resin film is patterned. Thus, an opening 13E through which the first insulating layer 12 is exposed is formed in an area located above the drain electrode 7D. As shown in the figure, the second insulating layer 13 may not be formed in the gate terminal portion formation region.

Note that the materials of these insulating layers 12 and 13 are not limited to the materials described above. The second insulating layer 13 may be an inorganic insulating layer, for example.

Next, as shown in FIGS. 8(a) to 8(d), the common electrode 15 and the third insulating layer 17 are formed on the second insulating layer 13.

The common electrode 15 is formed as follows, for example. First, a transparent conductive film (not shown) is formed by a sputtering method, for example, on the second insulating layer 13 and in the opening 13E. Then, the transparent conductive film is patterned to form the opening 15E in the transparent conductive film.

Photolithography methods known in the art can be used for the patterning. In this example, the opening 15E is arranged so that the opening 13E and the periphery thereof are exposed therethrough, as seen from the direction normal to the substrate 1. Thus, the common electrode 15 is obtained.

The transparent conductive film may be an ITO (indium tin oxide) film (thickness: 50 nm or more and 200 nm or less), an IZO film, a ZnO film (zinc oxide film), etc., for example. Herein, an ITO film whose thickness is 100 nm, for example, is used as the transparent conductive film.

The third insulating layer 17 may be formed by a CVD method, for example, on the common electrode 15, in the opening 15E of the common electrode 15 and in the opening 13E of the second insulating layer 13. In the gate terminal portion formation region, the third insulating layer 17 is formed on the interlayer insulating layer 11.

There is no particular limitation on the third insulating layer 17, which may suitably be a silicon oxide ($SiO_2$) film, a silicon nitride (SiNx) film, a silicon oxide nitride (SiOxNy; x>y) film, a silicon nitride oxide (SiNxOy; x>y) film, etc., for example. In the present embodiment, since the third insulating layer 17 is used also as a capacitive insulating film forming the storage capacitor, the material and the thickness of the third insulating layer 17 are preferably selected suitably so that a predetermined capacitance is obtained. The third insulating layer 17 may be an SiNx film or an $SiO_2$ film whose thickness is 100 nm or more and 400 nm or less, for example.

Next, as shown in FIGS. 9(a) to 9(d), in the TFT formation region, an opening 17E through which the copper-containing metal oxide film 8 is exposed is formed in the third insulating layer 17 and the first insulating layer 12. On the other hand, the contact hole CH2 through which the copper-containing metal oxide film 8 is exposed is formed in the gate terminal portion formation region. The contact hole CH2 is arranged so as to at least partially overlap with the source connection portion 7t as seen from the direction normal to the substrate 1.

As seen from the direction normal to the substrate 1, the opening 17E is arranged so as to be inside the opening 15E and to at least partially overlap with the opening 13E. Note that in the present specification, when the opening 13E, 15E, 17E is tapered, the shape of an opening as seen from the direction normal to the substrate 1 refers to the shape of the opening at the bottom thereof.

In this example, the third insulating layer 17 is arranged so as to cover the upper surface and the side surface of the common electrode 15 and a portion of the side surface of the opening 13E. Thus, the opening 13E in the second insulating layer 13, the opening 15E in the common electrode 15 and the opening 17E in the third insulating layer 17 together form the contact hole CH1 reaching the copper-containing metal oxide film 8.

There is no particular limitation on the method and conditions of the etching of the third insulating layer 17 and the first insulating layer 12. It may be done with a method and conditions such that the etching selectivity is sufficiently high between the first and third insulating layers 12 and 17 and the drain electrode 7D, and that at least a portion of the copper-containing metal oxide film 8 remains on the bottom surface of the contact hole CH1. Herein, the third insulating layer 17 and the first insulating layer 12 are etched (e.g., dry-etched) simultaneously using a resist mask (not shown).

Then, the resist mask is removed using a resist stripping solution (e.g., an amine-based stripping solution). Note that the resist stripping solution may possibly remove a portion of the copper-containing metal oxide film 8 in the contact holes CH1 and CH2, thereby thinning the copper-containing metal oxide film 8, as described above. Although not shown in the figure, the surface of the main layer 7a after the oxidation treatment may have irregularities due to thickness variations of the copper-containing metal oxide film 8. The surface irregularities are not reduced by the resist mask stripping solution. Therefore, even if it is brought into contact with the transparent conductive layer in this state, it is difficult to realize a desirable contact.

Next, as shown in FIGS. 10(a) to 10(d), a portion of the copper-containing metal oxide film 8 that is located in the contact holes CH1 and CH2 is removed. Herein, the copper-containing metal oxide film 8 is removed by a cleaning treatment using a chelate cleaning solution.

Thus, in the TFT formation region, the surface of the drain electrode 7D (i.e., the surface of the main layer 7a) is exposed through the contact hole CH1. In the gate terminal portion formation region, the surface of the source connection portion 7t (i.e., the surface of the main layer 7a) is exposed through the contact hole CH2. It is preferred that the copper-containing metal oxide film 8 is not exposed on the bottom surface of the contact holes CH1 and CH2 but only the Cu surface (the main layer 7a) is exposed, as seen from the direction normal to the substrate 1. That is, it is preferred that the copper-containing metal oxide film 8 is not arranged in an area of the upper surface of the drain electrode 7D or the source connection portion 7t that overlaps with the opening of the first insulating layer 12, as seen from the direction normal to the substrate 1. A portion of the copper-containing metal oxide film 8 that is located at the interface between the interlayer insulating layer 11 and the source/drain electrode 7 and the source line S remains unremoved.

The chelate cleaning solution may be a mixed solution of hydrogen peroxide water, a basic chemical liquid and water (the main component), for example. The basic chemical liquid may be TMAH (Tetramethylammonium hydroxide), for example. The temperature of the cleaning solution may be 30° C. to 40° C., for example, and the cleaning time may be about 60 to 90 seconds, for example.

Figure 11:
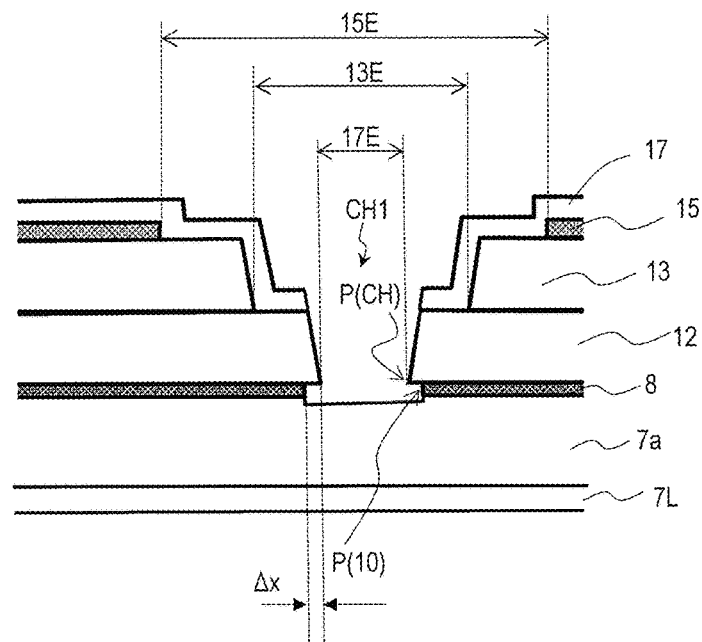
FIG. 11 A diagram schematically showing a cross-sectional structure of a substrate 1 after chelate cleaning.

FIG. 11 schematically shows an example cross-sectional structure of the substrate 1 after chelate cleaning. As shown in the figure, chelate cleaning may etch (side etch) the copper-containing metal oxide film 8 in the lateral direction (the direction parallel to the substrate 1). In such a case, as seen from the direction normal to the substrate 1, in the contact hole CH1, the edge portion P(10) of the copper-containing metal oxide film 8 is located on the outer side with respect to the edge portion P(CH) of the interlayer insulating layer 11 by the amount of side etch ($\Delta$x). In other words, as seen from the direction normal to the substrate 1, the edge portion of the copper-containing metal oxide film 8 is located so as to surround the opening 17E of the interlayer insulating layer 11. Chelate cleaning may remove not only the copper-containing metal oxide film 8 but also a portion of the surface portion (Cu) of the main layer 7a. This reduces the irregularities produced on the surface of the main layer 7a through the oxidation treatment, thereby flattening the contact surface. In such a case, as shown in FIG. 11, the surface of the main layer 7a to be the contact surface may be located below the surface thereof covered by the copper-containing metal oxide film 8. Note that although not shown in the figure, the copper-containing metal oxide film 8 is side-etched also in the contact hole CH2.

Then, a transparent conductive film (not shown) is formed by a sputtering method, for example, in the contact holes CH1 and CH2 and on the third insulating layer 17, and the transparent conductive film is patterned. Thus, the pixel electrode 19 in contact with the drain electrode 7D in the contact hole CH1 and the upper conductive layer 19t in contact with the source connection portion 7t in the contact hole CH2 are formed (see FIG. 2). In the present embodiment, the pixel electrode 19 has a comb-shaped planar shape having a plurality of cut-outs. Thus, the semiconductor device 100B is manufactured.

The transparent conductive film may be an ITO (indium-tin oxide) film (thickness: 50 nm or more and 150 nm or less), an IZO film, a ZnO film (zinc oxide film), or the like, for example. Herein, an ITO film whose thickness is 100 nm, for example, is used as the transparent conductive film.

While a two-layer electrode structure is formed, in which the pixel electrode is the upper layer, with the method described above, the pixel electrode 19 may be provided as the lower layer, and the common electrode 15 may be formed thereon with the third insulating layer 17 interposed therebetween. Specifically, first, after the interlayer insulating layer 11 is formed, the first insulating layer 12 is etched using the second insulating layer 13 as a mask, thereby forming the contact hole CH1. Then, the copper-containing metal oxide film 8 located on the bottom surface of the contact hole CH1 is removed by chelate cleaning, thereby exposing the Cu surface. Then, the pixel electrode 19 is formed in the contact hole CH1 and on the second insulating layer 13. Thus, it is possible to provide the pixel electrode 19 so that it is in direct contact with the drain electrode 7D in the contact hole CH1.

Note that when the first insulating layer 12 is etched using the second insulating layer 13 as a mask, there is no stripping of a resist mask, and the copper-containing metal oxide film 8 located on the bottom surface of the contact hole CH1 is not thinned by a resist stripping solution. In such a case, if the copper-containing metal oxide film 8 is removed by chelate cleaning, it is possible to more effectively reduce the contact resistance.

When the semiconductor device 100A shown in FIG. 1 is manufactured, the contact holes CH1 and CH2 may be formed in portions of the interlayer insulating layer 11 that are located over the drain electrode 7D and the source connection portion 7t, respectively, so that the copper-containing metal oxide film 8 is exposed on the bottom surface of the contact hole CH1. When the first and second insulating layers 12 and 13 are formed as the interlayer insulating layer 11, the contact hole CH1 may be formed by etching the first insulating layer 12 using the second insulating layer 13 as a mask. Alternatively, the interlayer insulating layer 11 may be one inorganic insulating layer or two or more inorganic insulating layers. For example, an inorganic insulating layer (thickness: 200 nm, for example) such as a silicon oxide ($SiO_2$) layer, a silicon nitride (SiNx) layer, a silicon oxide nitride (SiOxNy; x>y) layer and a silicon nitride oxide (SiNxOy; x>y) layer may be included. Such an inorganic insulating layer may be formed by a CVD method, for example. The interlayer insulating layer 11 may have a layered structure including an $SiO_2$ layer and an SiNx layer, for example. When an inorganic insulating layer is formed as the interlayer insulating layer 11, a resist mask may be formed on the inorganic insulating layer and the contact holes CH1 and CH2 may be formed in the interlayer insulating layer 11 using the resist mask. After the formation of the contact holes CH1 and CH2, chelate cleaning is performed so as to expose the Cu surface (the main layer 7a). Then, the pixel electrode 19 and the upper conductive layer 19t are formed in the contact holes CH1 and CH2, respectively, thereby obtaining the semiconductor device 100A.

While the copper-containing metal oxide film 8 is formed on the surface of the source wiring layer by an oxidation treatment in the method described above, the copper-containing metal oxide film 8 may be formed by a sputtering method, or the like. For example, a source wiring layer formation metal film and a copper-containing metal oxide film may be deposited successively using a sputtering method, and then patterned simultaneously. Thus, the source wiring layer whose upper surface is covered by the copper-containing metal oxide film is obtained. The side surface of the metal layer (electrodes and lines) included in the source wiring layer (which may hereinafter be referred to as the "side surface of the source wiring layer") is not covered by the copper-containing metal oxide film. Then, an oxidation treatment may be performed on the oxide semiconductor layer 5. In this process, the surface portion of the copper-containing metal oxide film 8 is further oxidized, thereby forming a region that has a higher oxygen proportion than the region on the main layer 7a side. On the other hand, as the side surface of the source wiring layer is exposed to the oxidation treatment, a copper-containing metal oxide film is formed on the side surface of the main layer 7a and a Ti oxide film on the side surface of the lower layer 7L.

Embodiment Example and Reference Example

As described above, in the embodiment, it is preferred that the copper-containing metal oxide film 8 exposed on the bottom surface in the contact holes CH1 and CH2 is removed by chelate cleaning. The present inventors studied the effect of chelate cleaning, and the method and the results of the study will now be described.

The semiconductor device 100B was produced by the method described above, as an embodiment example. As a reference example, a semiconductor device was produced by a method similar to the method described above, except that chelate cleaning was not performed after the formation of the contact hole CH1.

Figure 12:
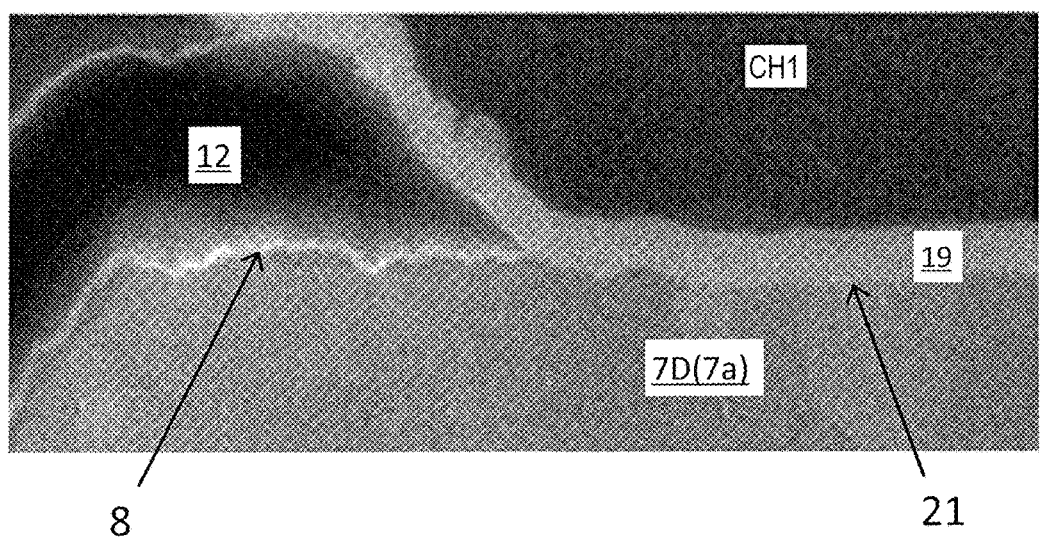
FIG. 12 An example cross-sectional SEM image of a contact portion between a drain electrode 7D and a pixel electrode 19 of a semiconductor device according to an embodiment example.

FIG. 12 illustrates a cross-sectional SEM image of the contact portion between the drain electrode 7D and the pixel electrode 19 of the semiconductor device according to an embodiment example.

It can be seen from FIG. 12 that a portion of the copper-containing metal oxide film 8 that is laid over the contact hole CH1 is entirely removed, and the main layer 7a of the drain electrode 7D and the pixel electrode 19 are in direct contact with each other in the contact hole CH1. The irregularities of the interface (contact surface) 21 between the main layer 7a of the drain electrode 7D and the pixel electrode 19 are less than the irregularities at the interface between the main layer 7a and the interlayer insulating layer 11 (i.e., the interface between the main layer 7a and the interlayer insulating layer 11 with the copper-containing metal oxide film 8 interposed therebetween). This indicates that the irregularities produced on a portion of the Cu surface that is to be the contact surface 21 are reduced and the portion is flattened by chelate cleaning in the oxidation treatment step.

Next, the contact resistance between the drain electrode 7D and the pixel electrode 19 of the semiconductor device of the embodiment example was compared with that of the reference example.

The semiconductor device of the embodiment example and that of the reference example each include a plurality of oxide semiconductor TFT 101 and a plurality of contact portions on the substrate 1. The drain electrode 7D of each oxide semiconductor TFT 101 is connected to the corresponding pixel electrode 19 in the contact portion. The present inventors measured the resistances of these contact portions (contact resistances) to obtain the average value Rave, the maximum value Rmax and the minimum value Rmin of the contact resistance.

Figure 13:
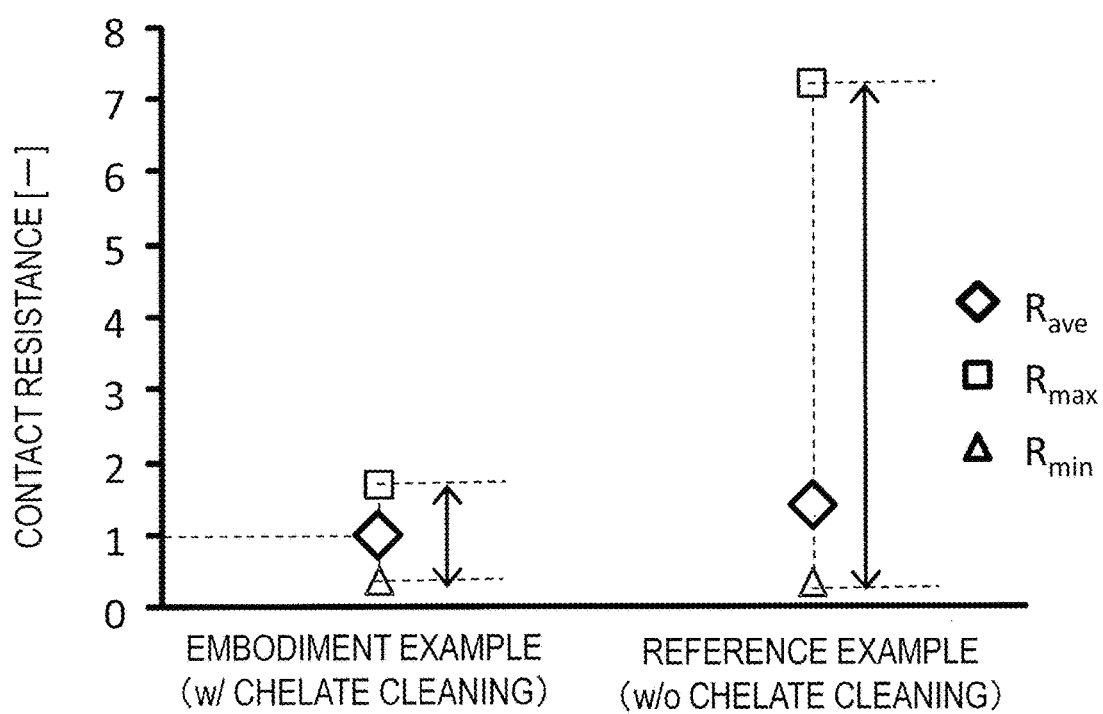
FIG. 13 A graph illustrating the contact resistance measurement results for semiconductor devices of an embodiment example and a reference example.
Figure 17:
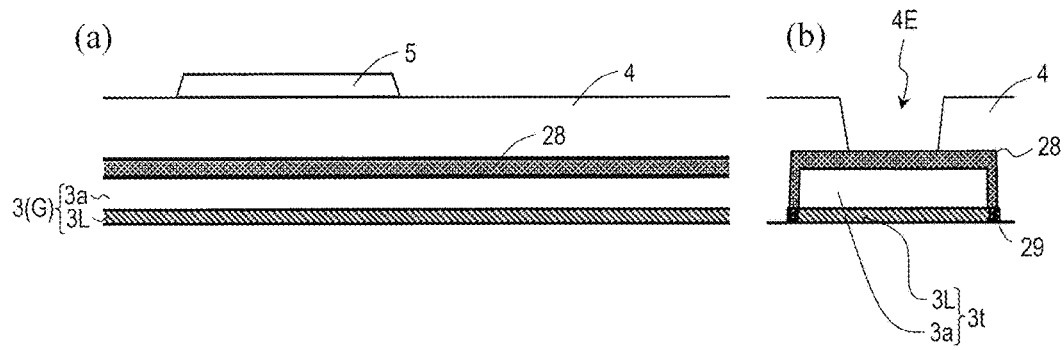
FIGS. 17 (*a*) and (*b*) cross-sectional views of a process step showing a TFT formation region and a gate terminal portion formation region, illustrating an example method for manufacturing the semiconductor device 200.
Figure 18:
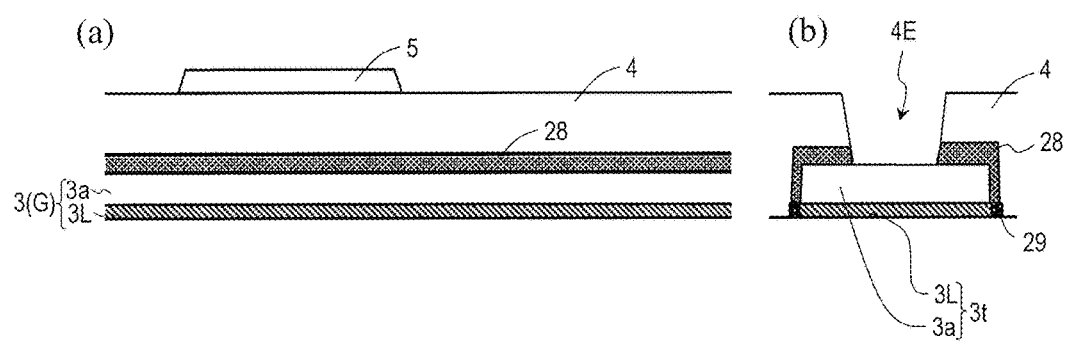
FIGS. 18 (*a*) and (*b*) are cross-sectional views of a process step showing a TFT formation region and a gate terminal portion formation region, illustrating an example method for manufacturing the semiconductor device 200.
Figure 19:
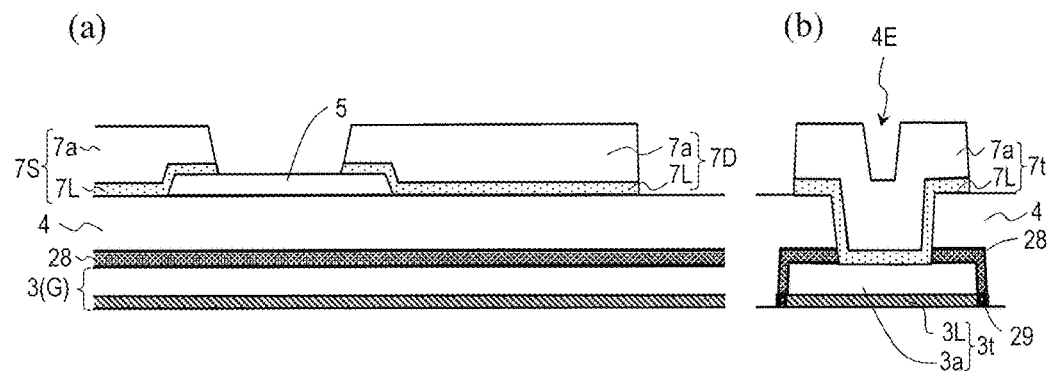
FIGS. 19 (a) and (b) are cross-sectional views of a process step showing a TFT formation region and a gate terminal portion formation region, illustrating an example method for manufacturing the semiconductor device 200.

FIG. 13 is a graph showing the contact resistance measurement results for the semiconductor device of the embodiment example and that of the reference example. The contact resistance along the vertical axis represents a value of the contact resistance for the semiconductor device of the embodiment example, standardized with the average value Rave.

It can be confirmed from the results shown in FIG. 13 that the average value Rave of the contact resistance can be lowered more for the semiconductor device of the embodiment example with chelate cleaning than for the semiconductor device of the reference example. This is believed to be because the copper-containing metal oxide film 8 remains in the contact hole CH1 to be interposed between the drain electrode 7D and the pixel electrode 19 in the reference example, whereas the copper-containing metal oxide film 8 that is located in the contact hole CH1 is removed by chelate cleaning in the embodiment example.

It can also be seen that with the semiconductor device of the reference example, the difference between the maximum value Rmax and the minimum value Rmin of the contact resistance is large, and the contact resistance varies significantly across the substrate 1. This is believed to be due to the thickness variations of the copper-containing metal oxide film 8 located between the drain electrode 7D and the pixel electrode 19 and the surface irregularities of the drain electrode 7D produced through the oxidation treatment. In contrast, with the semiconductor device of the embodiment example, the contact resistance variations across the substrate 1 are reduced significantly. This is believed to be because the copper-containing metal oxide film 8 is not present interposed between the drain electrode 7D and the pixel electrode 19, and the surface irregularities of the contact surface of the drain electrode 7D are reduced.

Note that the minimum value Rmin of the contact resistance for the semiconductor device of the embodiment example is about the same as that for the semiconductor device of the reference example. Thus, it is believed that for some contact portions of the semiconductor device of the reference example, a portion (surface portion) of the copper-containing metal oxide film 8 in the contact hole was removed by the resist mask stripping solution, thereby thinning the copper-containing metal oxide film 8 to such an extent that the contact resistance could be ignored. With a resist mask stripping solution, however, it is difficult to evenly and sufficiently thin the copper-containing metal oxide film 8 in the contact hole CH1 across the entire substrate 1. Therefore, there are contact portions having contact resistances that are five times or more the average value Rave, for example. In contrast, with the semiconductor device of the embodiment example, it is possible to remove the copper-containing metal oxide film 8 in the contact hole CH1 across the entire substrate 1. It is possible to suppress the contact resistance variations to about 25% or less, for example.

In the process of manufacturing the semiconductor devices 100A and 100B, an alignment mark may be provided on the substrate for alignment of a mask. An alignment mark is formed using the source wiring layer, for example. The alignment mark is read based on the reflectance as the alignment mark is irradiated with light, for example.

In some cases, an alignment mark is formed by using the source wiring layer. In such a case, when the upper surface of the source wiring layer is covered by the copper-containing metal oxide film 8, the irradiating light may possibly be diffused or absorbed, resulting in an alignment mark read error. In order to avoid this, a portion of the copper-containing metal oxide film 8 that is located on the upper surface of the alignment mark may be removed. For example, a portion of the copper-containing metal oxide film 8 that is located on the upper surface of the alignment mark may be removed, simultaneously with a portion of the copper-containing metal oxide film 8 that is located in the contact holes CH1 and CH2, using chelate cleaning. Thus, it is possible to suppress a read error due to the copper-containing metal oxide film 8. Since the surface irregularities of the alignment mark can be reduced, it is possible to further increase the readability.

Second Embodiment

A second embodiment of a semiconductor device according to the present invention will now be described.

The semiconductor device of the present embodiment has a structure, which suppresses not only the ambient light reflection due to the source wiring layer but also the ambient light reflection due to the gate wiring layer.

FIGS. 14(a) and 14(b) are cross-sectional views showing a portion of a pixel and a gate terminal portion 210, respectively, of a semiconductor device 200. Plan views are omitted since they are similar to FIGS. 3(c) and 3(d). In FIG. 14, like elements to those of FIG. 3 are denoted by like reference signs and will not be discussed below.

The semiconductor device 200 includes an oxide semiconductor TFT 201, the transparent conductive layer 19 electrically connected to the oxide semiconductor TFT 201, and the gate terminal portion 210.

The gate wiring layer of the present embodiment includes the gate electrode 3, the gate connection portion 3t and the gate lines G. A copper-containing metal oxide film 28 is formed on the upper surface of the gate wiring layer. In the illustrated example, the copper-containing metal oxide film 28 is formed not only on the upper surface, but also on the side surface, of the gate wiring layer. The copper-containing metal oxide film 28 may be formed in contact with the gate wiring layer.

The gate wiring layer may be formed by using a similar material to that of the embodiment described above. The gate wiring layer may have a single-layer structure or may have a layered structure. Note however that it is preferred in the present embodiment that the gate wiring layer includes the Cu-containing main layer 3a. In such a case, by performing an oxidation treatment on the main layer 3a, it is possible to form the copper-containing metal oxide film 28 on the surface of the main layer 3a.

In the illustrated example, the gate wiring layer includes the main layer (e.g., a Cu layer) 3a, and the lower layer (e.g., a Ti layer) 3L on the substrate 1 side of the main layer 3a. The copper-containing metal oxide film 28 is formed on the upper surface and the side surface of the main layer 3a. The copper-containing metal oxide film 28 is an oxide film formed through oxidization of the surface of the gate wiring layer (herein, the surface of the main layer 3a), for example. When a Cu layer is used as the main layer 3a, the copper-containing metal oxide film 28 is a Cu oxide film. A metal oxide film (herein, a Ti oxide film) 29 is formed on the side surface of the lower layer 3L. The metal oxide film 29 is an oxide film formed through oxidization of the surface of the lower layer 3L.

There is no particular limitation on the thickness of the copper-containing metal oxide film 28, which varies depending on the composition of the surface of the gate wiring layer and the method of formation thereof. The thickness of the copper-containing metal oxide film 28 may be the same as that of the copper-containing metal oxide film 8 formed on the surface of the source wiring layer, for example. That is, it is 20 nm or more and 100 nm or less, and preferably 20 nm or more and 60 nm or less.

The other elements are similar to those of the semiconductor device 100B described above with reference to FIG. 3.

According to the present embodiment, the copper-containing metal oxide film 28 is formed not only on the upper surface of the source wiring layer but also on the upper surface of the gate wiring layer. Therefore, it is possible to reduce not only the ambient light reflection occurring at the upper surface of the source wiring layer but also the ambient light reflection occurring at the upper surface of the gate wiring layer. Therefore, it is possible to more effectively suppress the lowering of display characteristics due to ambient light reflection.

Note that with the semiconductor device 200, the copper-containing metal oxide films 8 and 28 are formed on the upper surface of the source wiring layer and the upper surface of the gate wiring layer, but the copper-containing metal oxide film 28 may be formed only on the upper surface of the gate wiring layer and no copper-containing metal oxide film may be formed on the upper surface of the source wiring layer. Even in such a case, the copper-containing metal oxide film 28 realizes the effect of suppressing the ambient light reflection at the upper surface of the gate wiring layer.

<Manufacturing Method>

Next, referring to FIG. 15 to FIG. 19, an example method for manufacturing the semiconductor device 200 will be described. In these figures, (a) and (b) are cross-sectional views showing the TFT formation region and the gate terminal portion formation region, respectively.

First, as shown in FIGS. 15(a) and 15(b), a gate wiring layer including the gate electrode 3, the gate connection portion 3t and the gate electrode 3 is formed on the substrate 1. Then, the copper-containing metal oxide film 28 is formed on the upper surface of the gate wiring layer.

The gate wiring layer can be obtained by forming and patterning a gate line metal film (thickness: 50 nm or more and 500 nm or less, for example), as in the embodiment described above. In the present embodiment, a layered film including the Ti-containing lower layer 3L and the Cu-containing main layer (e.g., a Cu layer) 3a, for example, is formed as the gate line metal film. The materials of the lower layer 3L and the main layer 3a may be similar to those of the embodiment described above. Note however that it is advantageous that the main layer 3a includes Cu because it is then possible to form the copper-containing metal oxide film 28 by oxidizing the surface of the main layer 3a.

The copper-containing metal oxide film 28 can be formed through an oxidation treatment performed on the gate wiring layer. Thus, the copper-containing metal oxide film 28 is formed on the upper surface and the side surface of the main layer 3a, and the metal oxide film 29 is formed on the side surface of the lower layer 3L. Examples of the oxidation treatment include a plasma treatment using an $N_2O$ gas, a plasma treatment using an $O_2$ gas, an ozone treatment, etc., for example. Herein, a plasma treatment using an $N_2O$ gas is performed immediately before the formation of the gate insulating layer as a pre-treatment for forming the gate insulating layer by a CVD method. Thus, it is possible to perform the oxidation treatment without increasing the number of steps. It is also possible to perform the plasma treatment and the formation of the gate insulating layer in the same chamber.

There is no particular limitation on the conditions of the plasma treatment, but the conditions may be similar to the process conditions used when forming the copper-containing metal oxide film 8 on the source wiring layer, for example. That is, an $N_2O$ plasma treatment may be performed, where $N_2O$ gas flow rate: 3000 sccm, pressure: 100 Pa, plasma power density: 1 $W/cm^2$, process time: 200 to 300 sec, substrate temperature: 200° C. Thus, the copper-containing metal oxide film (Cu oxide film) 28 is formed whose thickness (average thickness) is 20 nm, for example.

Note that the copper-containing metal oxide film 28 may be a film that is deposited by a sputtering method. For example, the gate wiring layer can be formed by successively forming the gate line metal film and the copper-containing metal oxide film 28, and by simultaneously patterning them using the same mask. Using such a method, the copper-containing metal oxide film 28 is formed only on the upper surface of the gate wiring layer and is not formed on the side surface thereof.

Then, as shown in FIGS. 16(a) and 16(b), the oxide semiconductor layer 5 is formed after the gate insulating layer 4 is formed so as to cover the gate wiring layer.

The gate insulating layer 4 may be formed by a CVD method, or the like. The materials, the methods of formation, etc., of the gate insulating layer 4 and the oxide semiconductor layer 5 may be similar to those of the embodiment described above.

Then, as shown in FIGS. 17(a) and 17(b), in the gate terminal portion formation region, the gate insulating layer 4 is etched so as to form the opening 4E through which the copper-containing metal oxide film 28 is exposed. Note that when etching is performed using a resist mask, a portion of the copper-containing metal oxide film 28 may be removed and the copper-containing metal oxide film 28 may be thinned when stripping the resist mask. Even in such a case, the copper-containing metal oxide film 28 may remain on the bottom surface of the opening 4E.

Then, as shown in FIGS. 18(a) and 18(b), a portion of the copper-containing metal oxide film 28 that is located on the bottom surface of the opening 4E, thereby exposing the gate connection portion 3t (herein, the main layer 3a). The copper-containing metal oxide film 28 can be removed by chelate cleaning as is the copper-containing metal oxide film 8.

Then, as shown in FIGS. 19(a) and 19(b), the source wiring layer is formed. Specifically, first, a source line metal film (thickness: 50 nm or more and 500 nm or less, for example), not shown, is formed by a sputtering method, for example, on the gate insulating layer 4, in the contact hole CH2 and on the oxide semiconductor layer 5. Then, the source line metal film is patterned to obtain the source electrode 7S, the drain electrode 7D, the source connection portion 7t and the source lines S. The source connection portion 7t is arranged so as to be in direct contact with the gate connection portion 3t in the opening 4E.

The subsequent steps will not be described below as they are similar to those of the method for manufacturing the semiconductor device 100B.

While the copper-containing metal oxide film 28 is formed across the entire gate wiring layer formed on the substrate 1 in the method described above, the copper-containing metal oxide film 28 may be formed on a portion of the gate wiring layer. For example, an oxidation treatment may be performed while masking a portion of the gate wiring layer that is located in the non-display region, thereby forming the copper-containing metal oxide film 28 only in a portion located in the display region. In such a case, in the gate terminal portion located in the non-display region, no copper-containing metal oxide film is formed on the surface of the gate connection portion 3t. Therefore, there is no need for a step of removing the copper-containing metal oxide film after the formation of the opening 4E in the gate insulating layer 4.

Third Embodiment

A third embodiment of a semiconductor device according to the present invention will now be described.

The semiconductor device of the present embodiment further includes another metal wiring layer, in addition to source and gate wiring layers, and has a structure, which suppresses the ambient light reflection by the other metal wiring layer. The other metal wiring layer may have a structure in which the upper surface thereof is covered by the copper-containing metal oxide film and at least a portion of the side surface and the lower surface is in direct contact with another conductive layer. The other elements are similar to those of the semiconductor devices 100A, 100B and 200 of the embodiments described above.

Herein, the structure of the present embodiment will be described using, as an example, a semiconductor device including a common wiring layer as the other metal wiring layer. The common wiring layer includes lines (common lines) electrically connected to the common electrode 15. The common lines are provided for the purpose of reducing the resistance of the common electrode 15, which is a transparent conductive film. Note that the other metal wiring layer is not limited to the common wiring layer. For example, it may be a wiring layer that functions as the back gate of the oxide semiconductor TFT.

Figure 20:
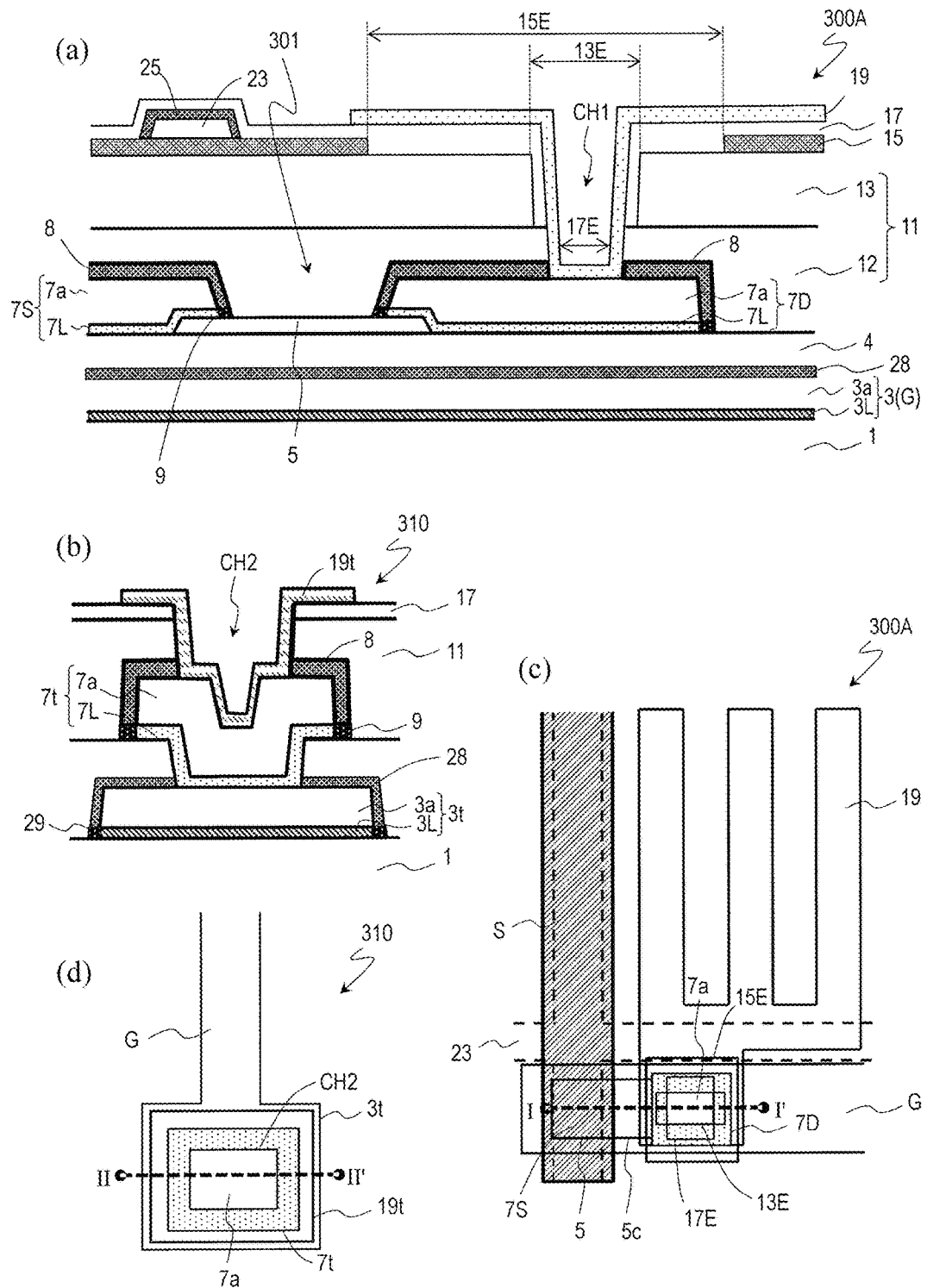
FIGS. 20 (a) and (b) are cross-sectional views showing a portion of a pixel and a gate terminal portion 310, respectively, of a semiconductor device 300A of a third embodiment, and (c) and (d) are plan views showing a portion of a pixel and the gate terminal portion 310, respectively, of the semiconductor device 300A.

FIGS. 20(a) and 20(b) are cross-sectional views showing a portion of a pixel and a gate terminal portion 310, respectively, of the semiconductor device 300A. FIGS. 20(c) and 20(d) are plan views showing a portion of a pixel and the gate terminal portion 310, respectively, of the semiconductor device 300A. FIG. 20(a) shows a cross section taken along line I-I' of FIG. 20(c), and FIG. 20(b) shows a cross section taken along line II-II' of FIG. 20(d). In FIG. 20, like elements to those of FIG. 1 to FIG. 14 are denoted by like reference signs and will not be discussed below.

The semiconductor device 300A includes an oxide semiconductor TFT 301, the pixel electrode 19 electrically connected to the oxide semiconductor TFT 301, and the gate terminal portion 310.

The common electrode 15 and a common line 23 electrically connected to the common electrode 15 are arranged on the interlayer insulating layer 11 covering the oxide semiconductor TFT 301.

As shown in FIG. 20(c), the common line 23 extends in the row direction and in the column direction, as seen from the direction normal to the substrate 1. In this example, the common line 23 extends in the column direction so as to be laid over the source line S and in the row direction so as to be adjacent to the gate line G, as seen from the direction normal to the substrate 1.

In the present embodiment, the lower surface of the common line 23 is in direct contact with the common electrode 15. A copper-containing metal oxide film 25 is arranged on the upper surface and the side surface of the common wiring layer including the common line 23. The common wiring layer is covered by the third insulating layer 17 with the copper-containing metal oxide film 25 interposed therebetween. The pixel electrode 19 is provided on the third insulating layer 17.

The common wiring layer may include Cu. In such a case, it is possible to form the copper-containing metal oxide film 25 on the upper surface and the side surface of the common wiring layer by performing an oxidation treatment on the common wiring layer. The oxidation treatment may be performed in a clean dry air. The method and conditions of the oxidation treatment may be similar to those of the embodiment described above. The thickness of the copper-containing metal oxide film 25 may be similar to the thickness of the copper-containing metal oxide film 8 on the source wiring layer, and may be 20 nm or more and 100 nm or less, and preferably 20 nm or more and 60 nm or less, for example.

The other elements are similar to those of the semiconductor device 200 described above with reference to FIG. 14.

According to the present embodiment, the copper-containing metal oxide film 25 is formed not only on the upper surface of the source wiring layer and the gate wiring layer but also on the upper surface of the common wiring layer. Therefore, it is possible to reduce the ambient light reflection occurring at the upper surfaces of the three wiring layers, and it is therefore possible to more effectively suppress the lowering of the display quality. Since the lower surface or the side surface of the common wiring layer becomes the contact surface, it is possible to cover the entire upper surface of the common wiring layer with the copper-containing metal oxide film, thereby further reducing the ambient light reflection.

Normally, when another metal line is provided in another layer separate from the source and gate wiring layers, the other metal line is designed so as to be laid over the source line or the gate line. Then, it is possible to add a metal line without increasing the ambient light reflection. However, as the number of wiring layers increases, misalignment is likely to increase. Thus, even if they are designed as described above, lines of different wiring layers may not be laid over each other but may be partially offset from each other. Particularly, in recent years, with medium- to small-sized displays such as smart phones, pixels have been further miniaturized, and misalignment is likely to occur between different wiring layers. In contrast, according to the present embodiment, since it is possible to reduce the ambient light reflection of the plurality of metal wiring layers, even if misalignment occurs, it is possible to more reliably suppress the lowering of the display quality due to ambient light reflection.

Note that while the copper-containing metal oxide films 8 and 28 are formed on the upper surfaces of the source wiring layer and the gate wiring layer of the semiconductor device 300A, the copper-containing metal oxide film may be formed on either one of the gate wiring layer and the source wiring layer. Even in such a case, it is possible to reduce the ambient light reflection from the upper surfaces of the two wiring layers, and it is therefore possible to suppress the lowering of display characteristics due to ambient light reflection.

The copper-containing metal oxide film 25 may be a film that is deposited by a sputtering method, or the like. For example, the common wiring layer can be formed by successively forming the common line formation metal film and the copper-containing metal oxide film using a sputtering method, and then simultaneously patterning these films. In such a case, the copper-containing metal oxide film 25 is formed only on the upper surface of the common wiring layer but is not formed on the side surface thereof.

<Manufacturing Method>

The semiconductor device 300A can be manufactured by a method similar to that of the semiconductor device 200. Note however that the common wiring layer is formed after the formation of the common electrode 15. The common wiring layer is formed by the following method, for example.

Steps up to the formation of the common electrode 15 are performed by a method similar to the embodiment described above. Then, a common line metal film is formed so as to cover the common electrode 15. Herein, a Cu-containing metal film such as a Cu film or a Cu alloy film is used as the common line metal film. There is no particular limitation on the thickness of the common line metal film, but it may be 50 nm or more and 300 nm or less, for example. Then, the common line metal film is patterned to form the common line 23. The lower surface of the common line 23 is in direct contact with the common electrode 15. Then, an oxidation treatment is performed on the common line 23, thereby forming the copper-containing metal oxide film 25 on the upper surface and the side surface of the common line 23. The method and conditions of the oxidation treatment may be similar to those for the copper-containing metal oxide films 8 and 28 described above. Preferably, a plasma treatment using an $N_2O$ gas is performed immediately before the formation of the third insulating layer as a pre-treatment for forming the third insulating layer by a CVD method. Thus, it is possible to form the copper-containing metal oxide film 25 without increasing the number of steps. Then, the third insulating layer 17 is formed so as to cover the common electrode 15 and the common line 23. The subsequent steps are similar to those of the embodiment described above.

Note that while the pixel electrode 19 is arranged above the common electrode 15 in the semiconductor device 300A, the common electrode 15 may be arranged on the pixel electrode 19 with the third insulating layer 17 interposed therebetween. Also in such a case, after the formation of the common electrode 15, the common line 23 may be provided, and the copper-containing metal oxide film 25 may be further formed.

<Variations>

The common line 23 may be arranged below the common electrode 15, i.e., between the common electrode 15 and the interlayer insulating layer 11. This will now be described in detail with reference to the drawings.

Figure 21:
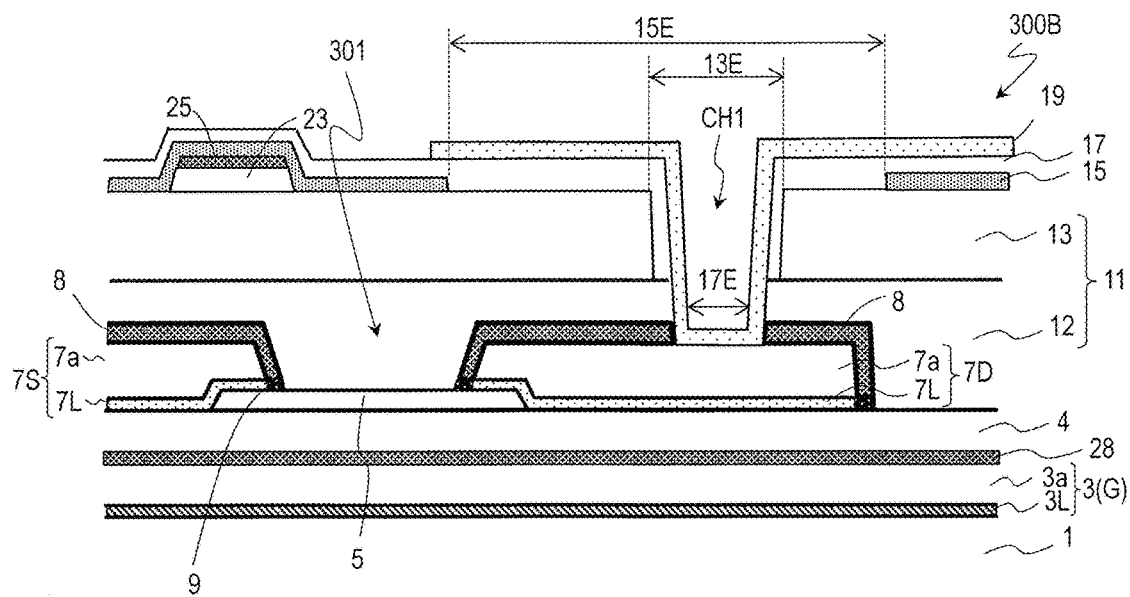
FIG. 21 A cross-sectional view showing a portion of a pixel of another semiconductor device 300B, respectively, of the third embodiment.

FIG. 21 is a cross-sectional view of a portion of a pixel of another semiconductor device 300B according to the present embodiment. The planar structure of the pixel and the configuration of the gate terminal portion are similar to those of the semiconductor device 300A (FIGS. 20(b) to 20(d)) and will not be described below.

In the semiconductor device 300B, the common line 23 is provided on the interlayer insulating layer 11. The copper-containing metal oxide film 25 is formed on the upper surface of the common line 23. The common electrode 15 is arranged so as to be in direct contact with the side surface of the common line 23 and to cover the common line 23 and the copper-containing metal oxide film 25. Thus, it is possible to suppress ambient light reflection occurring at the upper surface of the common line 23 while ensuring the electric connection between the common electrode 15 and the common line 23. The other elements are similar to those of the semiconductor device 300A.

The semiconductor device 300B can be manufactured by a method similar to that of the semiconductor device 200. Note however that it is different in that the common electrode 15 is formed after the formation of the common line 23 on the interlayer insulating layer 11.

Specifically, first, a common line metal film is formed on the interlayer insulating layer 11. There is no particular limitation on the material of the common line metal film. Preferably, it includes Cu or a Cu alloy, but it does not need to include Cu. Then, the copper-containing metal oxide film 25 is formed on the common line metal film. In the present embodiment, the copper-containing metal oxide film 25 is a deposited film that is formed by using a sputtering method, or the like. The copper-containing metal oxide film 25 is formed by sputtering using a Cu or Cu alloy target in an oxygen-containing atmosphere (e.g., an $Ar/O_2$ atmosphere), for example. Then, the common line metal film and the copper-containing metal oxide film 25 are patterned using the same mask. Thus, the common line 23 is obtained. While the upper surface of the common line 23 is covered by the copper-containing metal oxide film 25, the side surface is exposed. Then, the common electrode 15 is formed so as to be in contact with the exposed side surface of the common line 23. The subsequent steps are similar to those of the method for manufacturing the semiconductor device 100B.

Fourth Embodiment

A fourth embodiment of a semiconductor device according to the present invention will now be described.

The semiconductor device of the present embodiment is different from the first embodiment in that the source wiring layer includes a Cu alloy layer and a Cu alloy oxide film is formed on the upper surface of the source wiring layer.

Figure 22:
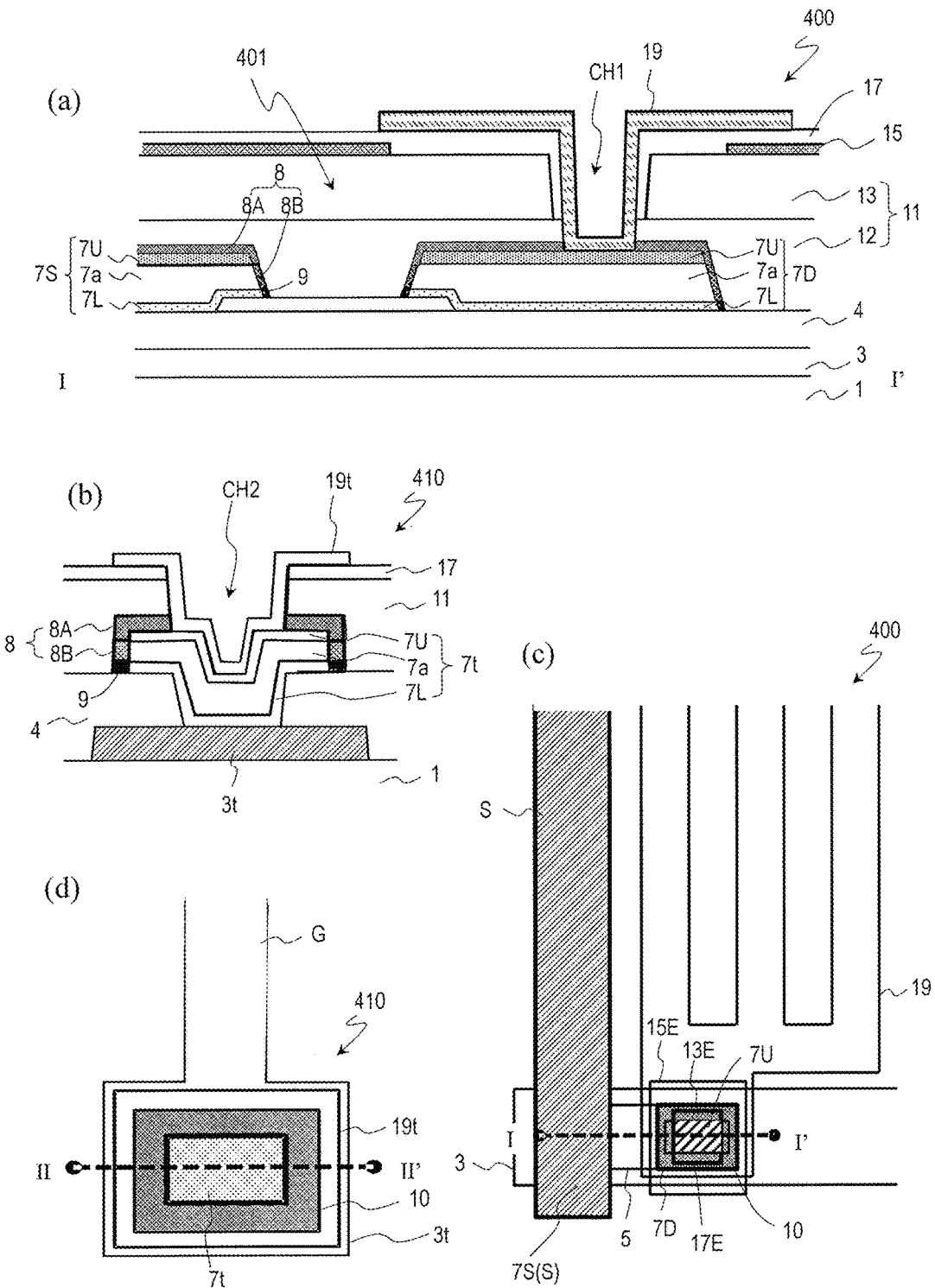
FIGS. 22 (a) and (b) are cross-sectional views showing a portion of a pixel and a gate terminal portion 410, respectively, of a semiconductor device 400 of a fourth embodiment, and (c) and (d) are plan views showing a portion of a pixel and the gate terminal portion 410, respectively, of the semiconductor device 400.

FIGS. 22(a) and 22(b) are cross-sectional views showing a portion of a pixel and a gate terminal portion 410, respectively, of the semiconductor device 400. FIGS. 22(c) and 22(d) are plan views showing a portion of a pixel and the gate terminal portion 410, respectively, of the semiconductor device 400. FIG. 22(a) shows a cross section taken along line I-I' of FIG. 22(c), and FIG. 22(b) shows a cross section taken along line II-II' of FIG. 22(d). In FIG. 22, like elements to those of FIG. 1 to FIG. 3 are denoted by like reference signs and will not be discussed below.

The semiconductor device 400 includes an oxide semiconductor TFT 401, the pixel electrode 19 electrically connected to the oxide semiconductor TFT 401, and the gate terminal portion 410.

The source wiring layer of the present embodiment includes the source/drain electrode 7 of the oxide semiconductor TFT 401, the source connection portion 7t of the gate terminal portion 410 and the source lines S. The source wiring layer has a layered structure including the lower layer 7L, the main layer 7a and the upper layer 7U from the substrate 1 side. The lower layer 7L may be arranged so as to be in contact with the oxide semiconductor layer 5. Herein, a Cu layer is used as the main layer 7a, a Ti layer as the lower layer 7L, and a Cu alloy layer as the upper layer 7U. The Cu alloy layer is only required to include a Cu alloy as the main component, and may include impurities. There is no particular limitation on the type and quantity of the metal element (referred to as an "additive metal element") which forms an alloy with Cu. Note that there is no particular limitation on the materials of the lower layer 7L and the main layer 7a. The lower layer 7L may include molybdenum (Mo). The main layer 7a is preferably a layer having a lower electric resistance than the lower layer 7L and the upper layer 7U. The main layer 7a may include a Cu alloy having a lower resistance than the Cu alloy of the upper layer 7L. The main layer 7a preferably includes Cu.

The copper-containing metal oxide film 8 is formed on the upper surface and the side surface of the source wiring layer. In the illustrated example, the copper-containing metal oxide film 8 includes a Cu alloy oxide film 8A formed on the upper surface and the side surface of the upper layer 7U, and a Cu oxide film 8B formed on the side surface of the main layer (herein, Cu layer) 7a. The Cu alloy oxide film 8A may be an oxide film that is formed by oxidizing the upper layer 7U (Cu alloy surface) of the source wiring layer, and the Cu oxide film 8B may be an oxide film formed by oxidizing the main layer 7a (Cu surface). The Cu alloy oxide film 8A may be formed in contact with the upper surface of the source wiring layer (herein, the upper surface of the upper layer 7U).

The other elements are similar to those described above with reference to FIG. 3.

In the present embodiment, a metal element that by nature is more likely to be oxidized than Cu is preferably included as the additive metal element of the Cu alloy. For example, at least one metal element selected from the group consisting of Mg, Al, Ca, Ti, Mo and Mn may be included as the additive metal element. Then, it is possible to more effectively suppress oxidization of Cu. The proportion of the additive metal element with respect to the Cu alloy (if two or more additive metal elements are included, the proportion of each additive metal element) may be more than 0 at % and 10 at % or less. Preferably, it is 1 at % or more and 10 at % or less. When it is 1 at % or more, it is possible to sufficiently suppress oxidization of Cu, and when it is 10 at % or less, it is possible to more effectively suppress Cu oxidization. When two or more metal elements are added, the total proportion thereof may be 0 at % or more and 20 at % or less, for example. Then, it is possible to more reliably suppress oxidization of Cu without increasing the electric resistance. The Cu alloy may be CuMgAl (Mg: 0 to 10 at %, Al: 0 to 10 at %), CuCa (Ca: 0 to 10 at %), etc., for example.

The copper-containing metal oxide film 8 is an oxide film formed through oxidization of the upper surface of the source wiring layer (herein, the surface of the Cu alloy layer which is the upper layer 7U) during the oxidation treatment performed on the channel region of the oxide semiconductor layer 5. In such a case, the Cu alloy oxide film 8A formed on the surface of the upper layer 7U includes copper oxide (CuO, $Cu_2O$) and an oxide of the additive metal element included in the Cu alloy of the upper layer 7U. For example, when a CuMgAl layer is used as the upper layer 7U, the Cu alloy oxide film 8A may include CuO, $Cu_2O$, MgO and $Al_2O_3$. These metal oxides coexist in the Cu alloy oxide film 8A, for example. The composition and thickness of the Cu alloy oxide film 8A can be examined by the Auger analysis, for example.

Note that the oxidation treatment may also oxidize the side surface of the source wiring layer, forming the metal oxide film 9 on the side surface of the lower layer 7L, the Cu oxide film 8B on the side surface of the main layer 7a, and the Cu alloy oxide film 8A on the side surface of the upper layer 7U.

There is no particular limitation on the thickness (average value) of the Cu alloy oxide film 8A because it varies depending on the composition of the surface of the source wiring layer, and the oxidation treatment method and conditions, etc., therefor, but it is for example 20 nm or more and 100 nm or less, and preferably 20 nm or more and 50 nm or less. As an example, when the Cu layer is oxidized by an $N_2O$ plasma treatment (e.g., $N_2O$ gas flow rate: 3000 sccm, pressure: 100 Pa, plasma power density: 1 $W/cm^2$, process time: 200 to 400 sec, substrate temperature: 200° C.), the thickness of the Cu alloy oxide film 8A is for example 10 nm or more and 50 nm or less, and more preferably 10 nm or more and 40 nm or less. Note that the thickness of the Cu alloy oxide film 8A obtained through oxidization of a Cu alloy surface is smaller than the thickness of a Cu oxide film that is formed when a Cu surface is oxidized under the same conditions.

The Cu alloy oxide film 8A is removed from the surface of the drain electrode 7D and the surface of the source connection portion 7t in the contact holes CH1 and CH2. As in the embodiment described above, a portion of the Cu alloy oxide film 8A that is located on the bottom surface of the contact holes CH1 and CH2 can be selectively removed by performing chelate cleaning, for example.

There is no particular limitation on the method for forming the Cu alloy oxide film 8A. The Cu alloy oxide film 8A may be a sputtered film that is formed by using a Cu alloy as the target in an oxygen-containing atmosphere (e.g., in an argon/oxygen atmosphere), for example. The Cu alloy oxide film 8A obtained by this method includes an oxide of a metal included in the Cu alloy target, irrespective of the material of the source wiring layer. Also in such a case, a portion of the Cu alloy oxide film 8A that is located on the bottom surface of the contact hole CH1 can be selectively removed by performing chelate cleaning after the formation of the contact holes CH1 and CH2.

According to the present embodiment, since the upper surface of the source wiring layer is covered by the copper-containing metal oxide film 8, as with the semiconductor devices 100A and 100B (FIG. 1 and FIG. 3), it is therefore possible to suppress ambient light reflection. Since the copper-containing metal oxide film 8 is not present interposed between at the contact surface between the source wiring layer and another conductive layer, it is possible to suppress the contact resistance.

Also in the present embodiment, advantageous effects similar to those described above with reference to FIGS. 12 and 13 are realized by performing chelate cleaning.

Moreover, the semiconductor device 400 has advantages a follows, as compared with the first embodiment (the semiconductor devices 100A and 100B).

With the semiconductor device 400, when a Cu layer is used as the main layer 7a, the upper layer 7U including a Cu alloy is formed on the Cu layer. Therefore, as compared with the embodiment described above, oxidization of Cu less easily proceeds during the oxidation treatment. This is because not only Cu but also a metal element added to Cu is oxidized during the oxidation treatment. If a metal element that is more easily oxidized than Cu is included, it is possible to more effectively suppress oxidization of Cu. As a result, it is possible to effectively suppress corrosion of an electrode due to oxidization of Cu. Moreover, it is possible to ensure a high adhesion with the interlayer insulating layer 11. Furthermore, when the oxidation treatment is performed under the same conditions, the thickness of the Cu alloy oxide film 8A that is obtained through oxidization of a Cu alloy surface is smaller than the thickness of the Cu oxide film that is obtained through oxidization of a Cu surface. Therefore, it is possible to reduce the irregularities produced on the surface of the source wiring layer through the oxidation treatment. It is also possible to more easily remove the Cu alloy oxide film 8A, and it is possible to reduce the amount of side etch of the Cu alloy oxide film 8A.

Moreover, with a conventional semiconductor device, when an alignment mark is formed using a Cu wiring layer, an alignment mark read error may occur due to oxidization and discoloration of the upper surface (Cu surface) of the alignment mark. In contrast, according to the present embodiment, since the Cu alloy oxide film 8A is formed on the upper surface of the alignment mark, such discoloration does not occur. Therefore, it is possible to form an alignment mark having a high readability.

<Manufacturing Method>

The semiconductor device 400 can be manufactured by a method similar to that of the semiconductor device 100B. The material, thickness and method of formation of the layers are similar to those of the semiconductor device 100B.

Note however that in the present embodiment, as the source line metal film, a layered film is formed including a Ti- or Mo-containing film (e.g., a Ti film), a Cu film and a Cu alloy film (e.g., a CuMgAl film) in this order starting from the substrate 1 side. The source line metal film may be formed by a sputtering method, for example. The Cu alloy film may be formed by using a target made of a Cu alloy.

The thickness upon deposition of the Cu alloy film to be the upper layer 7U is preferably 10 nm or more and 100 nm or less. When it is 10 nm or more, it is possible, in a later step, to form a Cu alloy oxide film capable of sufficiently reducing the reflectance of the Cu alloy surface and sufficiently suppressing oxidization of Cu. Note that the thickness of the upper layer 7U upon completion of the finished product is smaller than that upon deposition by the amount that is consumed for the formation of the Cu alloy oxide film 8A.

Also in the present embodiment, the oxidation treatment oxidizes the surface of the channel region 5c of the oxide semiconductor layer 5 and also oxidizes the surface of the source wiring layer, thereby forming the copper-containing metal oxide film 8 including the Cu alloy oxide film 8A and the Cu oxide film 8B. Herein, as the oxidation treatment, an $N_2O$ plasma treatment is performed, where $N_2O$ gas flow rate: 3000 sccm, pressure: 100 Pa, plasma power density: 1.0 W/cm2, process time: 200 to 300 sec, substrate temperature: 200° C., for example. Thus, the Cu alloy oxide film 8A is formed whose thickness is 10 nm, for example. Note that there is no particular limitation on the method and conditions of the oxidation treatment. Other oxidation treatments illustrated in the embodiment described above may be performed.

The oxidation treatment step also oxidizes the exposed side surface of the source/drain electrode 7. As a result, the metal oxide film (Ti oxide film) 9 may be formed on the side surface of the lower layer 7L, the Cu oxide film 8B on the side surface of the main layer 7a, and the Cu alloy oxide film 8A on the side surface of the upper layer 7U. In this example, the thickness of the Cu oxide film 8B is greater than the thickness of the Cu alloy oxide film 8A, and the thickness of the Ti oxide film is smaller than the thickness of the Cu alloy oxide film 8A.

Steps other than those described above are similar to the manufacturing steps for the semiconductor device 100B.

The present invention is not limited to the first to fourth embodiments described above. As described above, when at least one metal wiring layer on the substrate has a copper-containing metal oxide film on the upper surface, it is possible to suppress reflection of ambient light from the metal surface. More significant effects are realized if a copper-containing metal oxide film is formed on the surfaces of two or more wiring layers.

Note that while the copper-containing metal oxide film 28 is formed on a portion of the upper surface of the gate connection portion 3t in the gate terminal portion 210 shown in FIG. 14, the copper-containing metal oxide film 28 does not need to be formed on the surface of the gate connection portion 3t. For example, in some cases, the copper-containing metal oxide film 28 is formed on a portion of the gate wiring layer that is located in the display region, while the copper-containing metal oxide film 28 is not formed in a portion that is located in the non-display region.

Each of the oxide semiconductor TFTs of the embodiments above includes the gate electrode 3 arranged on the substrate 1 side of the oxide semiconductor layer 5 (bottom gate structure), but the gate electrode 3 may be arranged above the oxide semiconductor layer 5 (top gate structure). With the oxide semiconductor TFTs, the source and drain electrodes are in contact with the upper surface of the oxide semiconductor layer 5 (top contact structure), they may be in contact with the lower surface of the oxide semiconductor layer 5 (bottom contact structure). The oxide semiconductor TFT may have a channel-etched structure or may have an etch stop structure having an etch stop covering the channel region. If the oxide semiconductor TFT is of the channel-etched type, it is advantageous because the copper-containing metal oxide film can be formed on the surface of the source wiring layer simultaneously with the oxidation treatment performed on the channel region of the oxide semiconductor layer. Note that with a "channel-etched TFT", as shown in FIG. 1, no etch stop layer is formed on the channel region, and the channel-side edge portions of the source and drain electrodes are arranged so as to be in contact with the upper surface of the oxide semiconductor layer. A channel-etched TFT is formed by, for example, forming a conductive film to be a source/drain electrode on the oxide semiconductor layer, and performing source-drain separation. In the source-drain separation step, a surface portion of the channel region may be etched. On the other hand, in a TFT including the etch stop layer formed on the channel region (an etch stop-type TFT), the channel-side edge portions of the source and drain electrodes are located on the etch stop layer, for example. An etch stop-type TFT is formed by for example forming an etch stop layer covering a portion of the oxide semiconductor layer that is to be the channel region, and then forming a source/drain electrode conductive film on the oxide semiconductor layer and the etch stop layer, thus realizing source-drain separation.

The embodiment described above is suitably applicable to active matrix substrates using oxide semiconductor TFTs. Active matrix substrates can be used in various display devices such as liquid crystal display devices, organic EL display devices and inorganic EL display devices, and electronic devices including display devices, etc. On an active matrix substrate, oxide semiconductor TFTs can be used not only as switching elements provided in pixels but also as circuit elements of peripheral circuits such as drivers (monolithicization). In such a case, oxide semiconductor TFTs according to the embodiment of the present invention, which use an oxide semiconductor layer having a high mobility (e.g., 10 cm$^2$/Vs or more) as the active layer, can suitably be used as circuit elements.

INDUSTRIAL APPLICABILITY

The embodiment of the present invention is widely applicable to oxide semiconductor TFTs and various semiconductor devices including oxide semiconductor TFTs. For example, it is applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices.

REFERENCE SIGNS LIST

1 Substrate
3 Gate electrode
4 Gate insulating layer
5 Oxide semiconductor layer (active layer)
5s Source contact region
5d Drain contact region
5c Channel region
7S Source electrode
7D Drain electrode
7a Main layer
7U Upper layer
7L Lower layer
8, 8A, 8B, 25, 28 Copper-containing metal oxide film
9, 29 Metal oxide film
11 Interlayer insulating layer
12 First insulating layer
13 Second insulating layer
15 Common electrode
17 Third insulating layer
19 Pixel electrode
101, 102, 201, 301, 401 Oxide semiconductor TFT
100A, 100B, 200, 300A, 300B, 400 Semiconductor device

What is claimed is:

1. A semiconductor device comprising:
   a substrate;
   a thin film transistor supported on the substrate, an active layer of the thin film transistor being an oxide semiconductor layer;
   at least one metal wiring layer including copper supported on the substrate;
   a metal oxide film including copper arranged on an upper surface of the at least one metal wiring layer;
   an insulating layer covering the at least one metal wiring layer with the metal oxide film interposed therebetween; and
   a conductive layer in direct contact with a part of the at least one metal wiring layer, in an opening formed in the insulating layer, without the metal oxide film interposed therebetween,
   wherein the metal oxide film is present interposed between the at least one metal wiring layer and the insulating layer and the metal oxide film is not present, in the opening, interposed between the at least one metal wiring layer and the conductive layer.

2. The semiconductor device according to claim 1, wherein a thickness of the metal oxide film is 20 nm or more and 100 nm or less.

3. The semiconductor device according to claim 1, wherein
   the at least one metal wiring layer includes a copper layer, and the metal oxide film is a copper oxide film.

4. The semiconductor device according to claim 1, wherein:
   the at least one metal wiring layer includes a copper alloy layer;
   the copper alloy layer contains copper and at least one metal element other than copper; and
   the metal oxide film includes copper and the at least one metal element.

5. The semiconductor device according to claim 1, wherein the upper surface of the at least one metal wiring layer, except for a portion thereof that is in contact with the conductive layer, is covered by the metal oxide film.

6. The semiconductor device according to claim 1, wherein:
   the at least one metal wiring layer includes a plurality of metal layers formed from the same metal film; and
   the metal oxide film is arranged on upper surfaces and side surfaces of the plurality of metal layers.

7. The semiconductor device according to claim 1, wherein:
   the at least one metal wiring layer includes a source wiring layer;

the source wiring layer includes a source electrode and a drain electrode of the thin film transistor, and a source line electrically connected to the source electrode; and the conductive layer is in direct contact with the drain electrode in the opening.

8. The semiconductor device according to claim 1, wherein:

the at least one metal wiring layer includes a gate wiring layer; and the gate wiring layer includes a gate electrode of the thin film transistor and a gate line electrically connected to the gate electrode.

9. The semiconductor device according to claim 1, wherein the thin film transistor has a channel-etched structure.

10. The semiconductor device according to claim 1, wherein the oxide semiconductor layer includes an In—Ga—Zn—O-based semiconductor.

11. The semiconductor device according to claim 10, wherein the oxide semiconductor layer includes a crystalline portion.

12. The semiconductor device according to claim 1, wherein the metal oxide film is formed on the upper surface and side surfaces of the at least one metal wiring layer.

13. The semiconductor device according to claim 1, wherein the upper surface and side surfaces of the at least one metal wiring layer, except for a portion thereof that is in contact with the conductive layer, is covered by the metal oxide film.

14. The semiconductor device according to claim 1, wherein, in the opening, the at least one metal wiring layer is not covered by the metal oxide film.

15. The semiconductor device comprising:

a substrate;

a thin film transistor supported on the substrate, an active layer of the thin film transistor being an oxide semiconductor layer;

at least one metal wiring layer including copper supported on the substrate;

a metal oxide film including copper arranged on an upper surface of the at least one metal wiring layer;

an insulating layer covering the at least one metal wiring layer with the metal oxide film interposed therebetween; and a conductive layer in direct contact with a part of the at least one metal wiring layer, in an opening formed in the insulating layer, without the metal oxide film interposed therebetween, another metal wiring layer separates from the at least one metal wiring layer; and an upper surface of the other metal wiring layer is covered by another metal oxide film including copper, and a side surface or a lower surface thereof is in direct contact with another conductive layer.

* * * * *